United States Patent [19]
Doyle et al.

[11] Patent Number: 5,408,235
[45] Date of Patent: Apr. 18, 1995

[54] SECOND ORDER SIGMA-DELTA BASED ANALOG TO DIGITAL CONVERTER HAVING SUPERIOR ANALOG COMPONENTS AND HAVING A PROGRAMMABLE COMB FILTER COUPLED TO THE DIGITAL SIGNAL PROCESSOR

[75] Inventors: James T. Doyle, Chandler; Tim Beatty; Carl F. Liepold, both of Mesa, all of Ariz.

[73] Assignee: Intel Corporation, Santa Clara, Calif.

[21] Appl. No.: 207,040

[22] Filed: Mar. 7, 1994

[51] Int. Cl.$^6$ ........................ H03M 3/02; H03M 1/10
[52] U.S. Cl. ..................................... 341/143; 341/120
[58] Field of Search ............... 341/143, 155, 118, 120; 364/724.1; 375/26

[56] References Cited

U.S. PATENT DOCUMENTS

| | | | |
|---|---|---|---|
| 4,999,798 | 3/1991 | McCaslin et al. | 364/724.1 |
| 5,028,924 | 7/1991 | Thompson | 341/143 X |
| 5,030,954 | 7/1991 | Ribner | 341/143 X |
| 5,142,286 | 8/1992 | Ribner et al. | 341/143 |
| 5,144,308 | 9/1992 | Norsworthy | 341/143 X |
| 5,148,167 | 9/1992 | Ribner | 341/143 |
| 5,150,120 | 9/1992 | Yunus | 341/143 |
| 5,212,659 | 5/1993 | Scott et al. | 364/724.1 |
| 5,327,133 | 7/1994 | Greene | 341/143 |
| 5,327,137 | 5/1994 | Scheerer et al. | 341/168 |
| 5,345,236 | 9/1994 | Sramek, Jr. | 341/143 X |

Primary Examiner—Sharon D. Logan
Attorney, Agent, or Firm—Blakely, Sokoloff, Taylor & Zafman

[57] ABSTRACT

A "true" 16-bit second order Sigma-Delta based converter that has superior analog components and has a programmable comb filter which is coupled to the digital signal processor. This converter comprises a second order Sigma-Delta modulator and a programmable comb filter. The second order Sigma-Delta modulator dramatically attenuates the baseband quantization noise energy (which in turn increases the resolution of the converter), since its superior amplifiers and comparators enable it to oversample and coarsely quantize the analog input signal at a very high sampling frequency of 12 MHz. The amplifiers are class AB OTAs, which have cross coupled NMOS driven input stages, and cascoded output stages. Also, the common mode voltages are the optimal biasing points, and these voltages are kept constant by a differential input stage, by a PV independent temperature dependent current generator, by optimal device size, and by a common mode feedback circuitry. The programmable comb filter receives the coarsely digitized 1-bit output of the modulator at oversampling frequency $F_S$, and provides a more accurate representation of the input signal to the DSP at slower sampling rate of $F_S/N$. In addition, the comb filter uses a 20-bit data path, in order to enable the decimator (which is formed by the comb filter and by the FIR filter) to provide 16 bits of resolution to the DSP. The output of the programmable comb filter is then supplied to an FIR filter which is realized in the DSP, and this filter removes the remaining out-of-baseband noise.

16 Claims, 26 Drawing Sheets

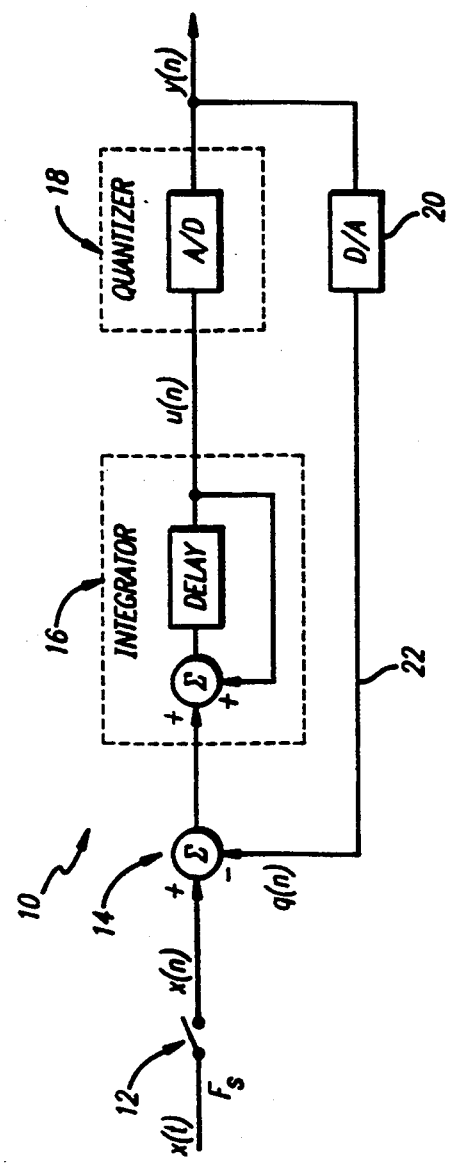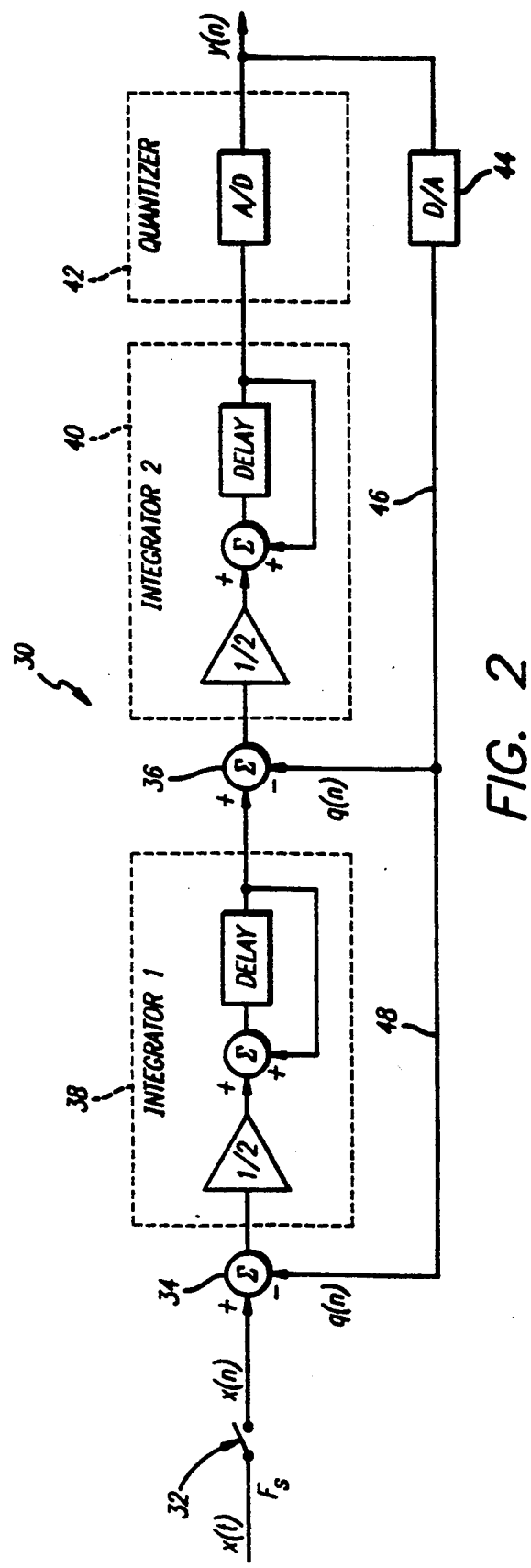
FIG. 1 PRIOR ART
FIG. 2 PRIOR ART

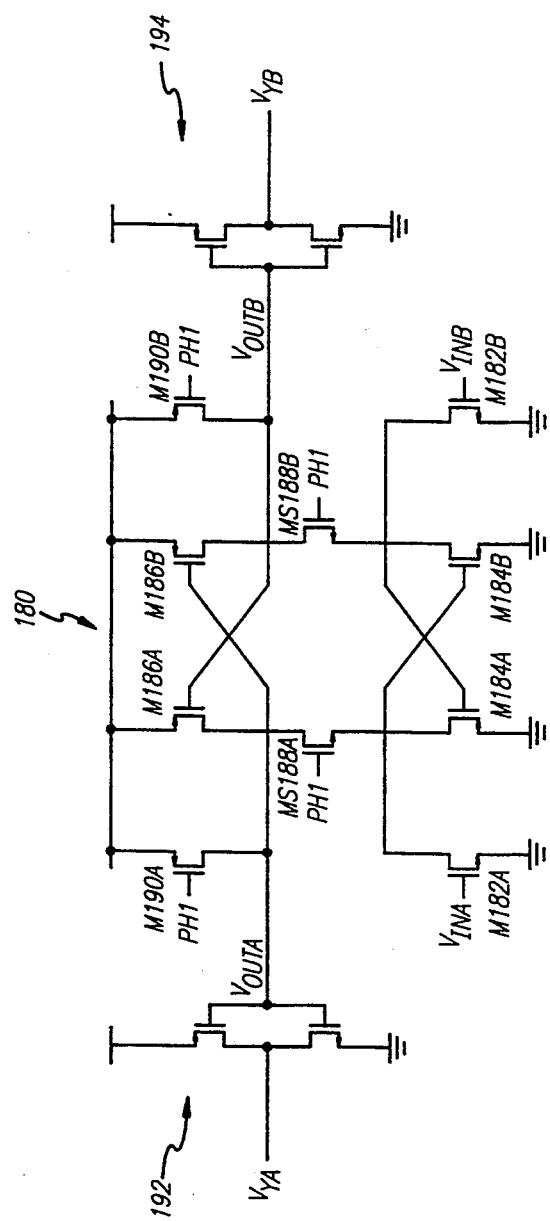
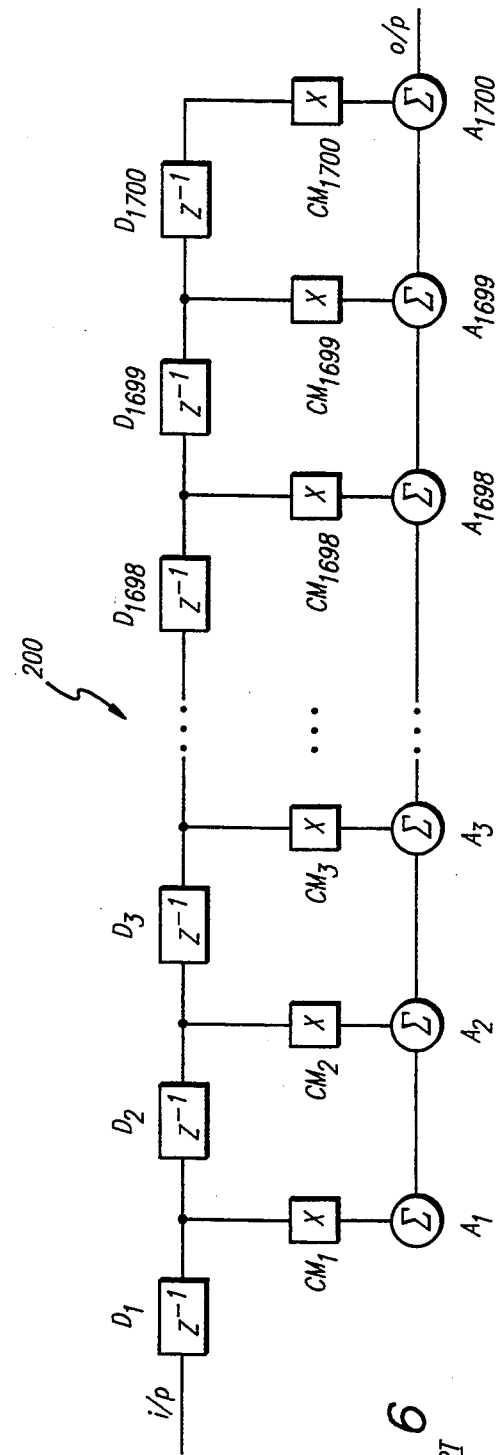
FIG. 5 PRIOR ART
FIG. 6 PRIOR ART

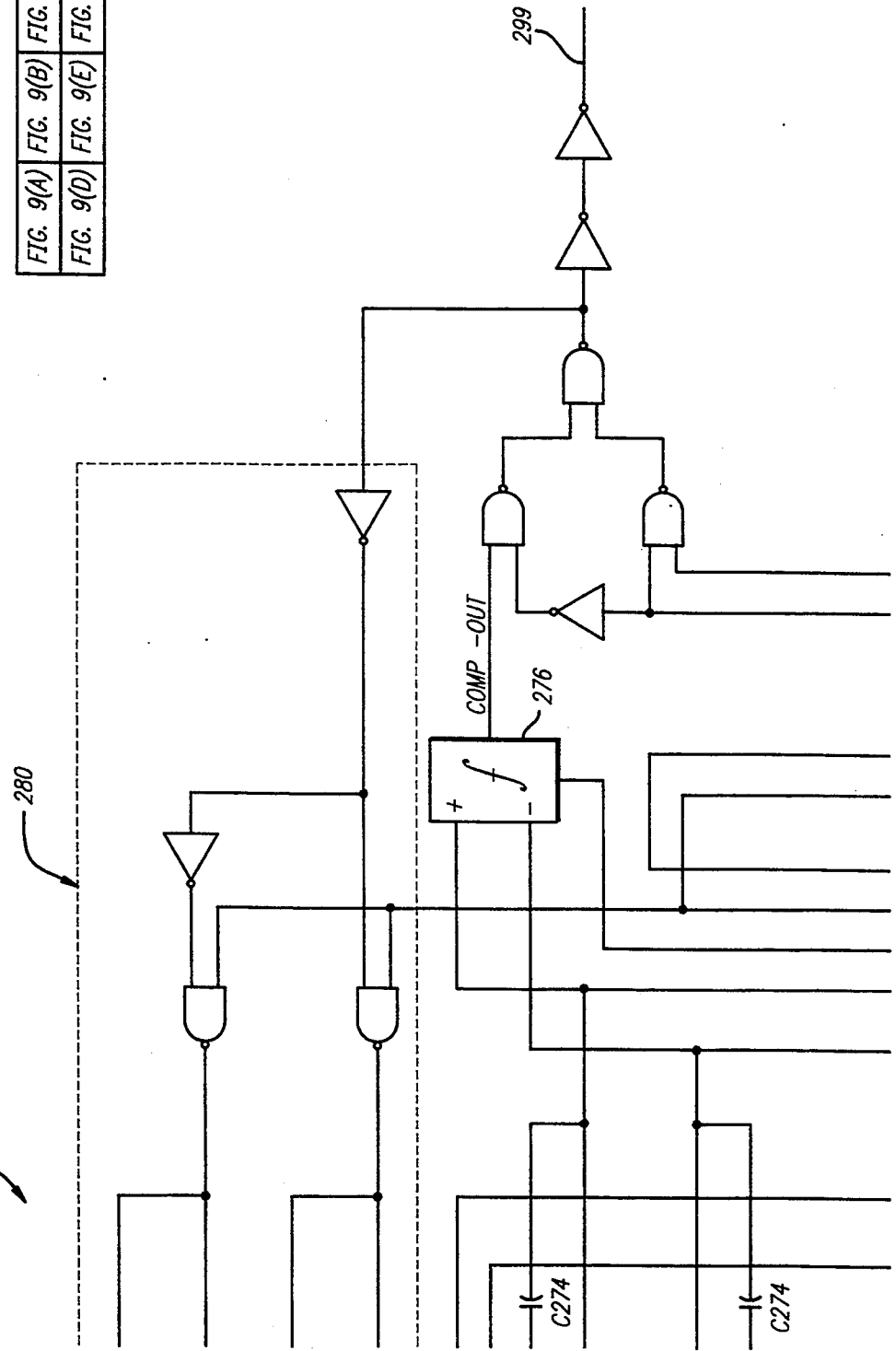

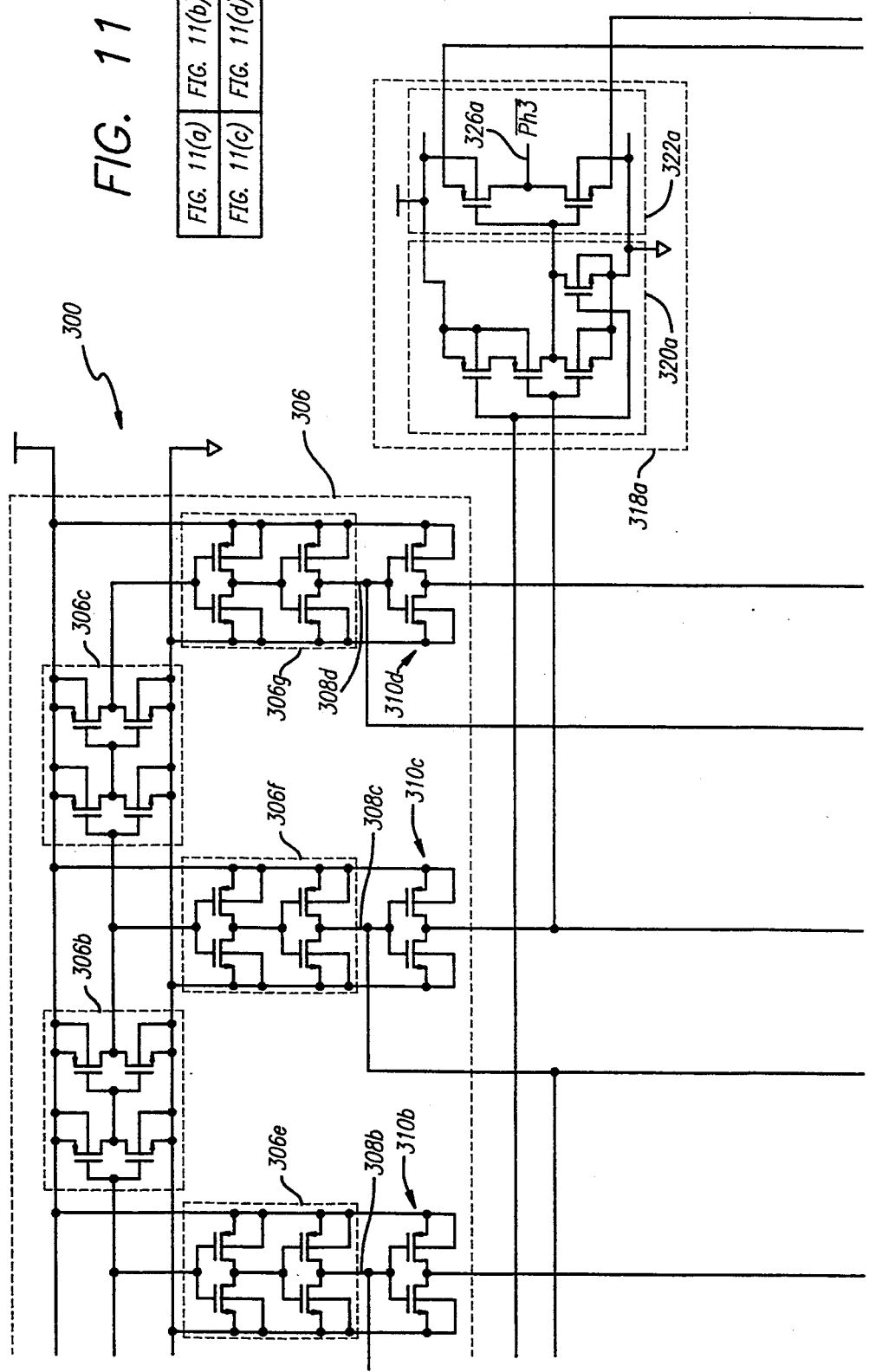

SECOND ORDER SIGMA-DELTA BASED ANALOG TO DIGITAL CONVERTER HAVING SUPERIOR ANALOG COMPONENTS AND HAVING A PROGRAMMABLE COMB FILTER COUPLED TO THE DIGITAL SIGNAL PROCESSOR

BACKGROUND OF THE INVENTION

1. Field of the Invention

This invention relates to the field of analog to digital converters, and particularly to a second order Sigma-Delta based converter having superior analog components, and having a programmable comb filter which is coupled to the digital signal processor.

2. Background Art

Most analog to digital (A/D) converters can be classified into two categories, Nyquist-rate converters and oversampling converters. Nyquist-rate converters sample the analog input signal at the Nyquist frequency, which is slightly more than twice the maximum frequency of the input signal. Oversampling converters, on the other hand, perform the sampling at a frequency that is several times greater than the Nyquist frequency.

For several reasons, the popularity of a particular oversampling converter, the Sigma-Delta based converter, has increased recently. One reason for this recent surge in the popularity of these converters is the compatibility of the Sigma-Delta based converters with VLSI technology. More precisely, Sigma-Delta based converters provide for monolithic integration of both the analog and digital sections on a single die, since Sigma-Delta based converters utilize digital filtering techniques and thus have a high percentage (almost 90%) of digital circuitry. Also, the popularity of Sigma-Delta based converters has increased because they take advantage of the exceptional high speeds achieved with VLSI technology. In other words, these oversampling converters trade the excess resolution in time for improved resolution in amplitude. In addition, the popularity of Sigma-Delta based converters is due to their simple anti-aliasing requirements. A Sigma-Delta based converter does not require an expensive anti-aliasing filter, since the transition band of an anti-aliasing filter of an oversampling A/D converter is much wider than its pass band, and since the complexity of the filter is a strong function of the ratio of the width of the passband to the width of the transition band.

A Sigma-Delta based analog-to-digital converter has a high resolution and a large dynamic range since it utilizes oversampling, noise shaping, and digital filtering techniques. More specifically, this type of converter uses a Sigma-Delta modulator which, by oversampling and coarsely quantizing the analog input signal, moves the quantization noise energy out of the baseband and toward the higher frequencies. For example, in order for a Sigma-Delta modulator to provide 16 bits of resolution, it must attenuate the baseband quantization noise by 96 decibels (i.e. it must have a dynamic range of 96 dB). The digital output of the modulator is then provided to a decimator, which acts as a lowpass digital filter by computing a more precise estimate for the analog input at a lower sampling rate. Consequently, the high resolution and large dynamic range of a Sigma-Delta based converter are attributable (1) to the Sigma-Delta modulator reducing the baseband quantization noise energy by oversampling the input signal, and (2) to the decimator filtering out the high-frequency quantization noise by computing a more accurate estimate of the analog input at a lower sampling rate.

a. Prior Art Sigma-Delta Modulators

FIG. 1 presents a block diagram of a first-order Sigma-Delta modulator. Modulator 10 comprises a sampler 12, a difference node 14, an integrator 16, a one bit quantizer 18, and a one bit D/A converter 20 in a feedback path 22. Modulator output y(n) is a digital signal, which has only one-bit of information representing either a 1 or $-1$. In addition, sampler 12 samples modulator input x(t) at frequency $F_S$, which is much larger than Nyquist rate $f_N$ (i.e. $F_S = M* f_N$, where M is the oversampling ratio). The difference between sampled input x(n) and output q(n) of D/A converter 20 (where q(n) is the analog representation of quantized output y(n)) is then integrated by integrator 16 and supplied to one-bit quantizer 18. The integrator's output u(n) equals the sum of its previous input, x(n-1)−q(n-1), and its previous output, u(n-1). Quantizer 18 then determines output digital signal y(n), whose value equals either (1) $+\Delta/2$ (where $\Delta$ is the quantizer step size) if u(n) > 0; or (2) $-\Delta/2$ if u(n) < 0.

Quantization error e(n) is the difference between the quantizer's output y(n) and the quantizer's input u(n). If D/A converter 20 is perfect (i.e. q(n)=y(n)), the quantizer's output y(n) equals the sum of input signal x(n-1) and quantization error due to the feedback loop e(n)−e(n-1). Therefore, as it can be seen from the equation y(n)=x(n-1)+(e(n)−e(n-1)), feedback loop 22 causes a first order difference of the quantization error (i.e. e(n)−e(n-1)) to appear at the output of the modulator, and this difference operation acts to attenuate the quantization noise at low frequencies by moving the noise energy to the higher frequencies. Consequently, even though quantization error e(n) at every sampling instance is large since a coarse one-bit quantizer is used, feedback loop 22 enables output signal y(n) to track the analog input signal x(t), and thus generates a 1 or −1 output which can be averaged (by the decimation filter as it will be described below) over several input sample periods to produce a very accurate result.

The attenuation of baseband noise energy can be improved by increasing the order of the Sigma-Delta modulator (i.e. by increasing the number of integrators in the forward path and thus performing a higher order difference operation of the quantization error) and by increasing the sampling rate. More precisely, the noise shaping ability (SB) of a Sigma-Delta modulator is described by the following equation:

$$S_B \sim (\pi^{2L}/(2L+1))*(f_N/F_S)^{2L+1}, \text{ where L is the order of the modulator.}$$

Therefore, as it can be seen from this equation, the resolution of a Sigma-Delta modulator can be increased (i.e. the low frequency quantization noise can be greatly attenuated) by increasing the oversampling ratio or the order of the modulator.

For numerous reasons, it is advantageous to realize a high resolution Sigma-Delta based converter by using a second order modulator with a higher oversampling ratio, rather than using a higher order (such as a third, fourth, etc.) modulator with a lower oversampling ratio. First, second order Sigma-Delta modulators are unconditionally stable (i.e. the output of the modulator does not go into limit cycle or oscillation as a function of the amplitude of the input signal), whereas higher orders modulators are only conditionally stable. Second, the system circuitry (such as the number of amplifiers, switches, etc.) of second order Sigma-Delta modulators is less complicated than the system circuitry of higher order modulators. In addition, the complicated system circuitry of higher order modulators introduces interference and cross talk problems. Third, as it will be described below, second order modulators require less complicated decimators, since the lower order of the second order modulators allows a lower order comb filter to be used. Fourth, the anti-aliasing requirements of a second order modulator are less stringent than a higher order modulator, (1) since the higher sampling rate of the second order modulator increases the ratio of the width of the transition band to the width of the pass band, and (2) since the complexity of the filter decreases as the ratio of the transition band to the passband increases.

However, in order to use a high resolution second order Sigma-Delta modulator with high sampling rate, the analog circuitry of the modulator needs to be exceptional. For example, in order to obtain 16 bits of resolution from a second order Sigma-Delta modulator processing audio and video signals (which have a 4 KHz bandwidth) at an oversampling frequency of 256 times the Nyquist frequency, the open loop gain of the amplifier must be 48 dB (gain~6 dB*$\log_2 256$, where 256 is the oversampling ratio M), the slew rate of the amplifier must be 300 V/$\mu$s (since the amplifier should be fast enough and stable enough to fully charge and discharge during one clock phase), and the unity gain bandwidth must be 60 MHz.

Unfortunately, the analog components of prior art second order Sigma-Delta modulators do not meet these stringent requirements. FIG. 2 presents the architecture of one prior art second order Sigma-Delta modulator. Modulator 30 comprises sampler 32, difference nodes 34 and 36, integrators 38 and 40, one-bit quantizer 42, and one-bit D/A converter 44 in feedback paths 46 and 48. Sampler 32 samples modulator input x(t) at the oversampling frequency $F_S$. The difference between sampled input x(n) and output q(n) of D/A converter 44 (which is the analog representation of quantized output y(n)) is then supplied to integrator 38. In turn, the difference, between the output of integrator 38 (which is equal to half of the integrator's previous input plus its previous output) and output q(n) of D/A converter 44, is supplied to integrator 40. The output of integrator 40 (which is equal to half of its previous input plus its previous output) is then supplied to one-bit quantizer 42, which determines the value of output digital signal y(n) to be either (1) $+\Delta/2$ (where A is the quantizer step size) if the input to the quantizer is greater or equal to zero; or (2) $-\Delta/2$ if its input is less than zero.

As it was the case for first order Sigma-Delta modulator 10 of FIG. 1, the impact of quantization error e(n) (i.e. the difference between the quantizer's output and input) on the resolution of the converter is dramatically reduced by the feedback loops of the Sigma-Delta modulator. More precisely, due to feedback loops 46 and 48, this second order Sigma-Delta modulator performs a second order difference operation of the quantization error, which greatly attenuates the quantization noise at low frequencies by moving the noise energy to the higher frequencies. Consequently, even though quantization error e(n) at every sampling instance is large since a coarse one-bit quantizer is used, feedback loops 46 and 48 enable output signal y(n) to track the analog input signal x(t). Therefore, the output of one-bit quantizer 42 can be averaged (by a decimator as it will be discussed below) over several input sample periods to produce a very accurate result.

Finally, it should be noted that the integration stages of second order Sigma-Delta modulator 30 of FIG. 2 have a gain of one half, whereas the integration stage of first-order Sigma-Delta modulator 10 of FIG. 1 has a gain of one. Ideally, for the Sigma-Delta modulator shown in FIG. 2 to be stable, the gain of each integration stage should not exceed one. In addition, due to non-ideal operating conditions (such as substrate coupling or feedthrough), the gain of each integrator should be even lower than its theoretical maximum limit of one. Therefore, the gain of the integration stages in FIG. 2 where chosen to be one half.

FIG. 3 presents a fully differential circuit implementation of the second-order Sigma Delta modulator of FIG. 2. This modulator comprises two integrator stages 52 and 54, eight sampling switches S56 and S58, four integrating switches S60, four feedback switches S62, and four sampling capacitors C64. Integrators blocks 52 and 54 comprise amplifier 66 and 68 and two integrating capacitors C70. The ratio of integrating capacitors C70 and sampling capacitors C64 is chosen so as to realize the gain of 0.5 that precedes each integrator in the architecture of FIG. 2. Furthermore, in order to avoid charge sharing problems, the operation of modulator 50 is controlled by a non overlapping two-phase clock. During the first phase, switches S56 and S58 are closed (switches are closed when the controlling clocks are high), while switches S60 and S62 are opened, and the inputs to each integrator are sampled onto capacitors C64. During the second phase, switches S56 and S58 are opened while switches S60 and S62 are closed, and this switching arrangement causes the charges that were stored on capacitors C64 during the first stage to be partially transferred to capacitors C70. Also, in phase 2, the closing of switches S62 has the effect of subtracting the outputs of the two-level D/A network from the inputs to each integrator. One bit quantizer 72 then compares the outputs of integrator 54 during phase 1, and resets during phase 2. With this clocking arrangement, the time available for the integration and the time for the comparison are both one-half of a clock cycle.

The charge injected by the MOS switches in the circuit is a common-mode signal that is canceled by the differential implementation of the modulator. Signal dependent charge injection is further suppressed by opening switches S58 and S60 slightly before switches S56 and S62 respectively. Since switches S58 and S60 are connected to either a ground or virtual ground node, they do not exhibit signal dependent charge injection. Once either switches S58 or switches S60 have opened, and before the other set of switches have closed, capacitors C64 are floating; thus, the subsequent opening of switches S56 or switches S62 during the interval when both switches S58 and S60 are open will not inject charge onto capacitors C64.

FIG. 4 presents the operational amplifier used in this prior art second order Sigma-Delta modulator of FIG. 3. Amplifier 80 was chosen since it can provide a high slew rate as it is class AB amplifier. Transistors M82–M108 make up the input stage of this amplifier. Furthermore, the input stage is driven by P-channel MOS transistors M82 and M84, since the differential input signals (VIN+ and VIN−) are applied to the gates of these two transistors. In addition, transistors M90-M96 realize the level shift necessary to bias M82-M88, and the bias current (due to current source I174 and current mirrors formed by transistors M142, M106, and M108) that flows through transistors M90-M96 establishes the quiescent current of the amplifier. Consequently, provided that the input stage transistors operate in the saturation region, the drain currents of these input stage transistors are proportional to the square of the input voltage.

In turn, the current in the input stage is mirrored (by the current mirrors formed by transistors M98 and M110, M100 and M112, M102 and M114, and M104 and M116) into the output stage of the amplifier, where transistors M110, M118, M122, and M114 form the positive differential output stage and transistors M112, M120, M124, and M116 form the negative differential output stage. Cascode transistors M118-M124 are employed in the output stages to increase the output impedance, and hence the gain of the amplifier. In addition, the biasing of the cascode devices is adjusted dynamically according to the desired output current level, by the dynamic biasing transistors M126-M140. This dynamic biasing technique leads to greatly increased signal range at the output of the amplifier.

Common mode voltage levels within the amplifier are controlled by the feedback circuitry formed by transistors M146-M156, capacitors C158-C164, and biasing current source I176. The common mode voltage of amplifier outputs VOUT+ and VOUT− is set by the current flowing through transistors M146 and M148. The gates of these transistors are controlled by the midpoint of the voltage divider consisting of capacitors C158 and C160. These capacitors sense the common-mode output of the amplifier and at the same time provide the voltage level shift necessary to set the operating point of M146 and M148. The purpose of capacitor C162 and C164 is to establish the charge on C158 and C160, such that the correct voltage shift and the desired common-mode voltage (i.e. 2.5 volts) are achieved.

FIG. 5 presents the circuit diagram of one-bit quantizer 72 (which is a comparator) of FIG. 2. Comparator 180 is a simple regenerative latch that does not have preamplification or offset cancellation. This comparator is fully differential, with inputs $V_{INA}$ and $V_{INB}$ and buffered outputs $V_{YA}$ and $V_{YB}$. The core of this comparator is formed by two inverters consisting of transistors M184A, M186A, M184B, and M186B which are connected as a latch. During the reset phase of the comparator (PH1 is low), switches MS188A and MS188B are open, thus breaking the positive feedback of the latch. Switches MS190A and MS190B pull the outputs of the comparator, $V_{OUTA}$ and $V_{OUTB}$, to the positive supply rail. The drain of M184A and M184B are discharged through the input transistors M182A and M182B. During the compare phase of the comparator (PH1 goes high), switches MS188A and MS188B are closed and the positive feedback in the latch is enabled. The voltage difference applied at the inputs $V_{INA}$ and $V_{INB}$ causes the difference between output $V_{OUTA}$ and $V_{OUTB}$ to regenerate exponentially towards the supply voltage. The outputs are then interpreted as a logic zero or one, which represent the result of the comparison. The outputs $V_{YA}$ and $V_{YB}$ of the buffer inverters 192 and 194 are fed into a set/reset flip flop (not shown in FIG. 5) which holds the result of the comparison for a full clock cycle. Finally, when the signal at either input of the comparator is smaller than the threshold voltage of an N-channel transistor, the drain of M184A or M184B is not discharged. Since the common mode output voltage of second-order Sigma-Delta modulator 50 of FIG. 3 equals 2.5V, one of the two input transistors of the comparator is always conducting; under these circumstances, the result generated by the comparator is correct even when one of the input transistors is turned off.

Unfortunately, these analog components of Sigma-Delta modulator 50 of FIG. 3 do not satisfy the stringent performance requirements due to the high oversampling ratio. For example, while amplifier 80 of FIG. 4 satisfies the 48 dB gain requirement (this amplifier has a gain of 60 dB), it does not satisfy the 300V/μs slew rate requirement (the slew rate of this amplifier is only 200V/μs), and does not satisfy the 60 MHz unity gain bandwidth requirement (this amplifier has a unity gain bandwidth of 8 MHz). Consequently, due to the analog circuitry, a Sigma-Delta based converter that uses modulator 50 does not have a resolution of 16 bits and a dynamic range of 96 dB, but rather only provides 14.5 bits of resolution and 80 dB of dynamic range. In addition, the dynamic range of this prior art converter decreases by 3 dB when the frequency of the input signal is 8 KHz. Therefore, in the field of analog to digital converters, there is a need for a second order Sigma-Delta modulator that has robust analog circuitry, which enables a Sigma-Delta based converter to obtain 16 bits of resolution and 96 dB of dynamic range. This is recognized as the requirement for professional audio and state of the art modems.

b. Prior Art Decimators

As mentioned before, a decimator receives the coarsely quantized one-bit digital output from the Sigma-Delta modulator at the oversampling frequency $F_S$, in order to provide the digital signal processor (DSP) with a higher resolution representation of the input signal at a much lower sampling rate (such as Nyquist sampling rate $f_N$). A decimator simultaneously performs a digital filtering function and a rate reduction function. More precisely, a decimator digitally filters out the out-of-baseband quantization noise energy (i.e. the high frequency noise energy that the oversampling Sigma-Delta modulator moved out of the baseband and into the high frequencies) and reduces the sampling rate of the converter, by averaging the output of the modulator over several input sample periods.

One of the most popular averaging techniques utilizes Finite Impulse Response (FIR) filters, which consider only a finite number of inputs samples in order to compute the output. Alternatively stated, the number of input samples that the FIR filter considers is a function of the impulse response duration of the FIR. FIG. 6 presents one typical prior art FIR filter that provides the necessary 90 dB noise attenuation for Sigma-Delta modulator 50 of FIG. 3. As FIG. 6 shows, FIR filter 200 (which is based on the Pack-McClellan theory) provides 90 dB noise attenuation by using 1700 delay elements D1-D1700, 1700 coefficient multipliers CM1-CM1700, and 1700 adders A1-A1700.

Unfortunately, prior art decimator 200 of FIG. 6 has several deficiencies. First, FIR filter 200 is quite complex and expensive since it needs to attenuate all of the out-of-baseband quantization noise and thus needs 1700 delay elements, 1700 multipliers, and 1700 adders. Second, this FIR filter is not very effective at removing all of the out-of-baseband quantization noise energy. Third, the signal to noise ratio of the Sigma-Delta based converter is limited, because FIR filter 200 does not track the bandwidth of the input signal and because its sample rate reduction cannot be adjusted for a specific application. Also, in an FIR implementation, if the bandwidth is changed, all of the coefficients have to be readjusted because the bandwidth and the filter shape (response) do not scale with the clock alone.

SUMMARY OF THE INVENTION

The present invention discloses a "true" 16-bit second order Sigma-Delta based converter that has superior analog components and has a programmable comb filter which is coupled to the digital signal processor. This converter comprises a second order Sigma-Delta modulator and a programmable comb filter. The second order Sigma-Delta modulator attenuates the baseband quantization noise energy by more than 96 dB, since its superior analog components enable it to oversample and coarsely quantize the analog input signal at an oversampling frequency that can be as large as 12 MHz (i.e. the oversampling ratio is 256 for an input signal having a frequency of 23.4 KHz). In turn, the dramatic attenuation of the baseband quantization noise allows the Sigma-Delta based converter to have a high resolution (16 bits). In addition, the Sigma-Delta based converter of the present invention can also be used with applications that have a wider bandwidth than 23.4 MHz (such as Group Specialty Mobile-GSM--applications that have a bandwidth of 200 MHz); however, in such instances, going to wider bandwidths effectively reduces the dynamic range of the converter.

The second order Sigma-Delta modulator of the present invention uses superior amplifiers and comparators, in order to sample the input signal at a very high frequency. For example, class AB operational transconductance amplifiers (OTAs) are used as the amplifiers of the modulator, since these amplifiers have high power efficiency, slew rate, and signal recovery ratio. These OTAs have an input stage, an output stage, a dynamic biasing stage, and a common mode feedback stage. The input stage of an OTA is driven by N-channel MOS transistors, which in turn increases the speed of the OTA as N-channel MOS transistors are faster than P-channel MOS transistors. The input stage driving transistors are also cross coupled, which increases the gain of the OTA by 6 dB, because the cross coupling enables both the NMOS and the PMOS devices of the output stage to be active. The gain of the OTA is also increased by cascoding the output stage devices.

The gain and current drive of the OTA are also increased (1) by making the common-mode voltages (i.e. the operational biasing points) of the OTA equal to 3.2 volts (which maximizes the linear range of operation), and (2) by preventing variations in power supply voltage, input voltage, operating temperature, and process (i.e. transistor conductance parameters) from changing these common-mode voltages. The input stage of the OTA prevents the DC level of the input signals from changing the common-mode voltages of the OTA, since it is a differential input stages. Also, a current generator is used to maximize the linear region of operation and the gain of the OTA, by establishing the optimal common mode voltages and by preventing these common mode voltage from varying with process (P), supply voltage (V), and temperature (T) (i.e. from varying with PVT). More precisely, the current generator uses a PTAT technique to generate a biasing current that is invariant to changes in process and voltage (i.e. that is PV invariant), while being slightly dependent on the temperature in order to offset the effects due to temperature on the common mode voltages and the gain of the OTA. Furthermore, the linear range of operation is maximized by using the optimal device sizes. In addition, common mode feedback circuitry is used to optimally bias the OTA and to prevent the optimal biasing points from varying. The common mode feedback circuitry is based on sampling the differential output signals using switched capacitor techniques. This common mode feedback circuitry can be disabled in order to decrease the power consumption, to decrease the noise generated by the feedback circuitry, to increase the dynamic range of the modulator, and to increase the speed of the amplifier.

In order for the OTA to have a 5 volt ±10% operation range, device size optimization techniques and body effect compensation techniques are utilized (i.e. the bulk of the P-channel devices are tied to their sources in order to cancel the back bias contribution to the body effect, which in turn reduces the effective threshold of the devices and thus allows lower voltage operation). Also, the OTAs were designed to have zero degrees of phase margin at the unity gain bandwidth into a 10 pf capacitive load, which in turn allows lower voltage operation. Furthermore, in one embodiment of the present invention, one of two comparators performs the one-bit quantization of the sampled input signal of the second order Sigma-Delta modulator. By using two comparators, the bias point can be selected more optimally for a given input signal level. Also, the input stage of one of the two comparators is level shifted so that the trip points of the comparator are close to the common mode voltage of its input signal, which in turn increases the response of this comparator.

The second order Sigma-Delta based converter's programmable comb filter receives the coarsely digitized 1-bit output of the modulator at oversampling frequency $F_S$, and provides a more accurate representation of the input signal to the DSP at slower sampling rate of $F_S/N$. More precisely, this comb filter digitally filters out most of the out-of-baseband quantization noise energy by averaging the output of the modulator over N input sample periods and by performing a sample rate reduction of N:1. In addition, this comb filter is programmable, since it receives clock signal $F_S$ of the modulator and since its sample rate reduction ratio can be adjusted. This programmability feature of the comb filter increases the signal to noise ratio of the converter, because (by receiving the modulator clock signal and adjusting the number of sample periods) the comb filter's sample rate reduction can be optimized for a particular input signal with a specific bandwidth. This is a form of adaptation which allows this circuit to be configured more optimally for a given application. Finally, the comb filter uses a 20-bit data path (having 19 effective data bits and 1 sign data bit), in order to enable the decimator (which is formed by the comb filter and by the FIR filter that is realized within the DSP) to provide 16 bits of resolution to the processor.

The output of the programmable comb filter is then supplied to an FIR filter which is realized in the DSP. This FIR filter digitally filters out the remaining out-of-baseband quantization noise energy, by computing a weighted average of a finite number of the comb filter's outputs and by performing a 4:1 rate reduction, in order to provide the processor with a 16-bit resolution representation of the inputs signal at Nyquist sampling rate $f_N$. This FIR filter comprises of two half band filters which are respectively called a Goodman filter and a Post-Processor filter; each of these filters attenuates the out-of-baseband quantization noise by performing a 2:1 rate reduction. In addition, the coefficients of the Goodman filter are slightly different than the Park-McClellan recommended coefficients for this filter, because the coefficients of this filter restore the flat baseband frequency response by counteracting the magnitude drooping at the upper baseband frequencies due to the comb filter. Also, in order to maintain a linear phase response, the coefficients of the two half band filters have symmetric values.

BRIEF DESCRIPTION OF THE DRAWINGS

FIG. 1 presents a diagram of a prior art architecture for a first order Sigma-Delta modulator.

FIG. 2 presents a diagram of a prior art architecture for a second order Sigma-Delta modulator.

FIG. 5 presents the circuit diagram of the comparator used in the prior art second order Sigma-Delta modulator of FIG. 3.

FIG. 6 presents the circuit diagram of a prior art decimator comprising a FIR filter.

DETAILED DESCRIPTION OF THE INVENTION

Figure 4:
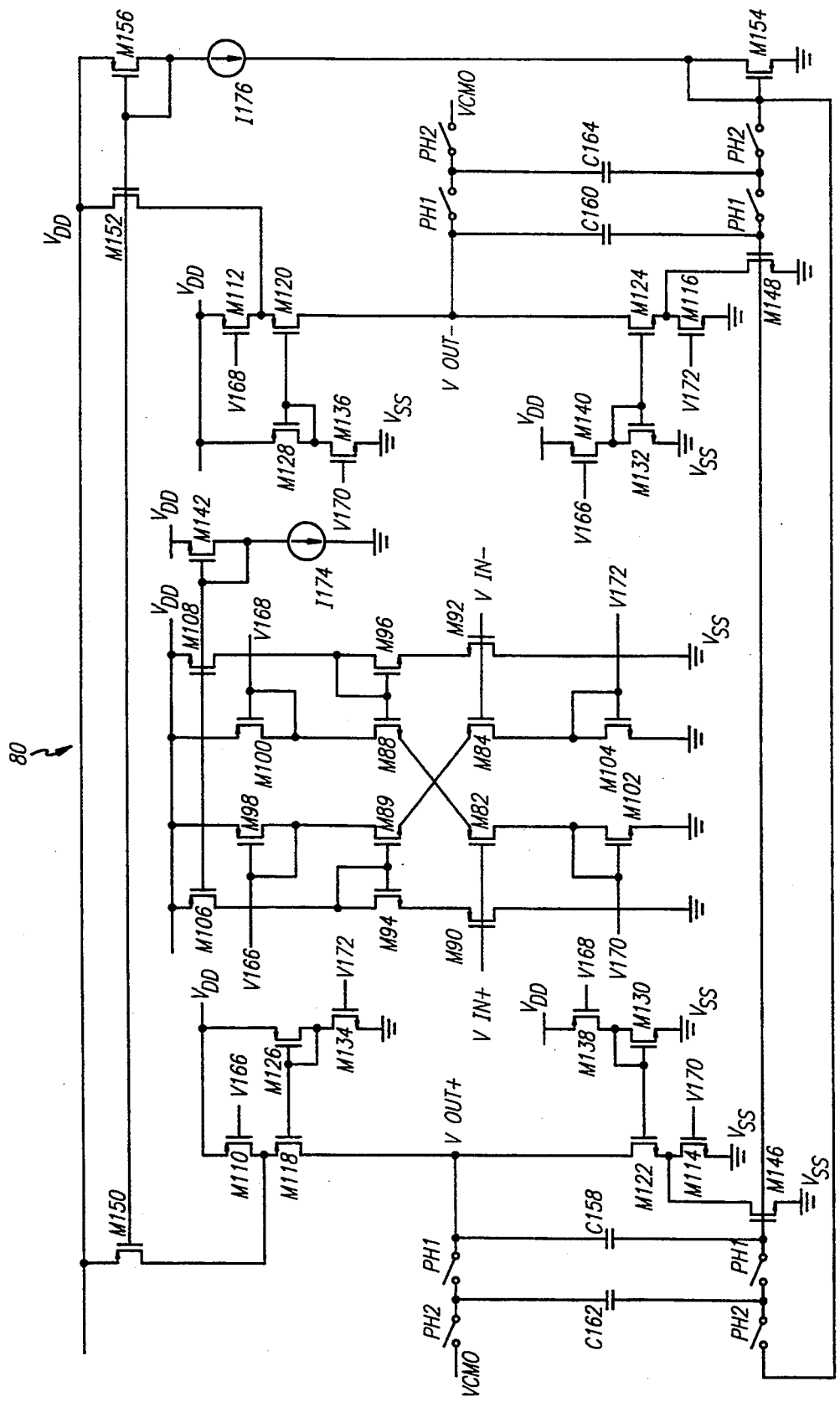
FIG. 4 presents the circuit diagram of the operational amplifier used in the prior art second order Sigma-Delta modulator of FIG. 3.

In the following description, numerous specific details, such as schematic diagrams, voltages, etc. are set forth to provide a thorough understanding of the invention. However, it will be obvious to one skilled in the art that the invention may be practiced without the use of these specific details. In other instances, well-known circuits are shown in block diagram form in order not to obscure the present invention with unnecessary detail. In addition, in the accompanying figures, N-channel ("NMOS") transistors are illustrated as shown by transistor M102 of FIG. 4, and P-channel CPMOS") transistors are illustrated as shown by transistor M100 of FIG. 4. All the transistors in the embodiment shown herein are enhancement mode devices. In the normal use of the invention, a power supply voltage is provided at the $V_{DD}$ connection shown in the figures. Typically, $V_{DD}$ is maintained at +5 volts. Also, in the normal use of the invention, the $V_{SS}$ connection shown in the figures is maintained at ground. Of course, other voltages may be utilized by those skilled in the art for $V_{DD}$ and $V_{SS}$.

Figure 7:
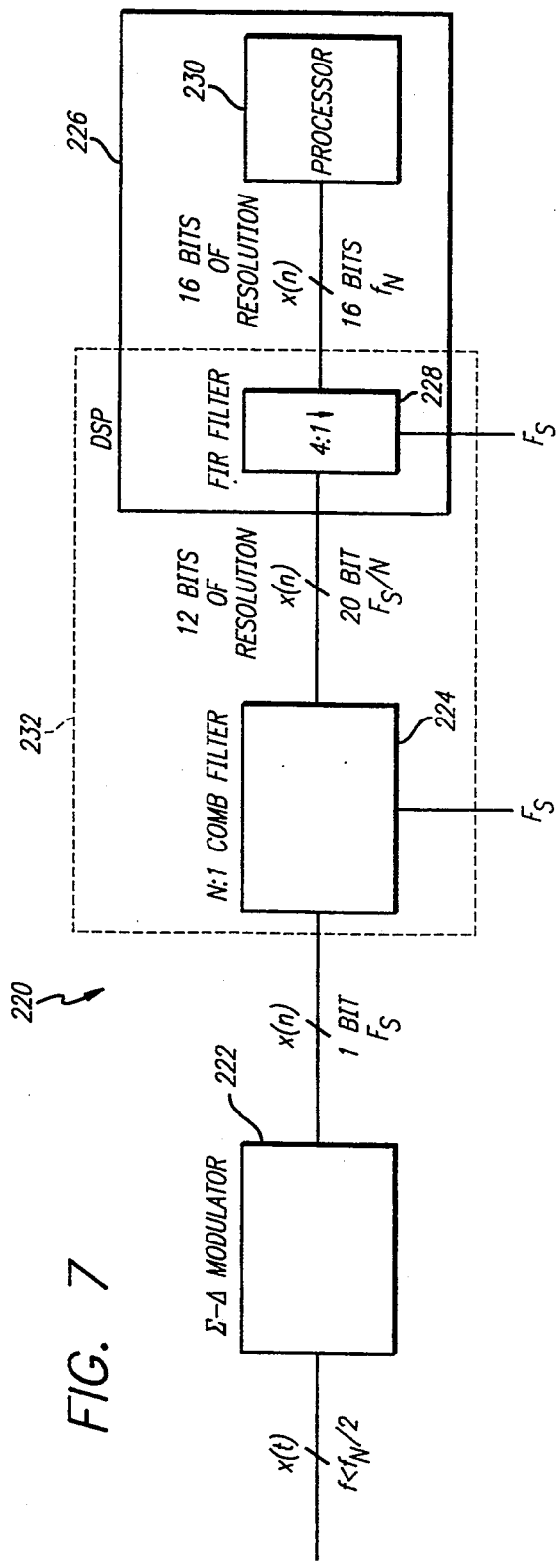
FIG. 7 presents the block diagram of the Sigma-Delta based converter, of the present invention, having superior analog components and having a programmable comb filter coupled to a digital signal processor.

The present invention discloses a "true" 16-bit second order Sigma-Delta based converter that has superior analog components and has a programmable comb filter which is coupled to the digital signal processor. FIG. 7 presents the block diagram of this converter coupled to a digital signal processor. As it can be seen from this figure, converter 220 comprises second order Sigma-Delta modulator 222 and programmable comb filter 224. Second order Sigma-Delta modulator 222 attenuates the baseband quantization noise energy by approximately 100 dB, because its superior analog components enable it to oversample and coarsely quantize analog input signal x(t) at an oversampling frequency that can be as large as 12 MHz (i.e. an oversampling ratio of 256 for an input signal having a frequency of 23.4 KHz). In turn, the dramatic attenuation of the baseband quantization noise allows Sigma-Delta based converter 220 to have a high resolution (16 bits).

Programmable comb filter 224 receives the coarsely digitized 1-bit output of the modulator at oversampling frequency $F_S$, and provides a more accurate representation of the input signal to DSP 226 at slower sampling rate of $F_S/N$ (where N represents an operator-adjustable number of sample periods). More precisely, comb filter 224 digitally filters out most of the out-of-baseband quantization noise energy by averaging the output of the modulator over N input sample periods and by performing a sample rate reduction of N:1. The default sample rate reduction of this comb filter is 64:1. However, since this comb filter is programmable, an operator can adjust the sample rate reduction (i.e. the operator can select the number of sample periods N) by using a divide by N circuitry. Comb filter 224 is also programmable because it receives clock signal $F_S$ of modulator 222. This programmability feature of comb filter 224 increases the signal to noise ratio of converter 220, because (by receiving the modulator clock signal and adjusting the number of sample periods) the comb filter's sample rate reduction can be optimized for a particular input signal with a specific bandwidth. Furthermore, comb filter 224 uses a 20-bit data path (having 19 effective data bits and 1 sign data bit), in order to enable decimator 232 (which is formed by comb filter 224 and FIR filter 228) to provide 16 bits of resolution to processor 230.

The output of the programmable comb filter is supplied to FIR filter 228, which is realized in DSP 226. This filter is used since comb filter 224 is not very effective at removing a large volume of out-of-baseband quantization noise, and since the frequency response of the comb-filter causes some magnitude drooping at the upper region of the baseband. FIR filter 228 digitally filters out the remaining out-of-baseband quantization noise energy by computing a weighting function on the output of the comb filter and by performing a 4:1 rate reduction. More precisely, FIR filter 228 (1) receives from comb filter 224 the 20-bit samples (each having 12-bits of resolution) at a frequency of $F_S/N$, (2) attenuates the out-of-baseband (i.e. frequency range from DC to $f_N/2$) quantization noise energy, and (3) provides processor 230 with a set of 16-bit samples (each having 16-bits of resolution) representing the input signal at the Nyquist sampling rate $f_N$. In addition, FIR filter restores the flat baseband frequency response by counteracting the magnitude drooping at the upper baseband frequencies due to the comb filter. Also, in order to maintain linear phase response, the coefficients of FIR filter 228 have symmetrical values.

Finally, for the embodiment of the present invention that is shown in FIG. 7, Sigma-Delta modulator 222 and comb filter 224 are realized on one die, while FIR filter 228 and processor 230 are realized on a different die, in order to isolate the modulator from the noisy digital processing circuitry. The availability of low cost fixed point DSPs also makes it economically advantageous to realize the DSP and the modulator on different dies. Furthermore, from a power consumption efficiency stand point, it is advantageous to have the DSP and the modulator separated, because the DSP can be powered down to 3 volts. This separation (of the modulator and the comb filter on one die, and the FIR filter and the processor on another die) has shown to improve the results by greater than 10 dB in actual applications. However, it would be obvious to one skilled in the art that the present invention also could be realized on one single die, since the digital filtering techniques of the present invention increase the feasibility for monolithic implementation of the modulator and the DSP on a single die.

1. Second Order Sigma-Delta Modulator

Figure 8:
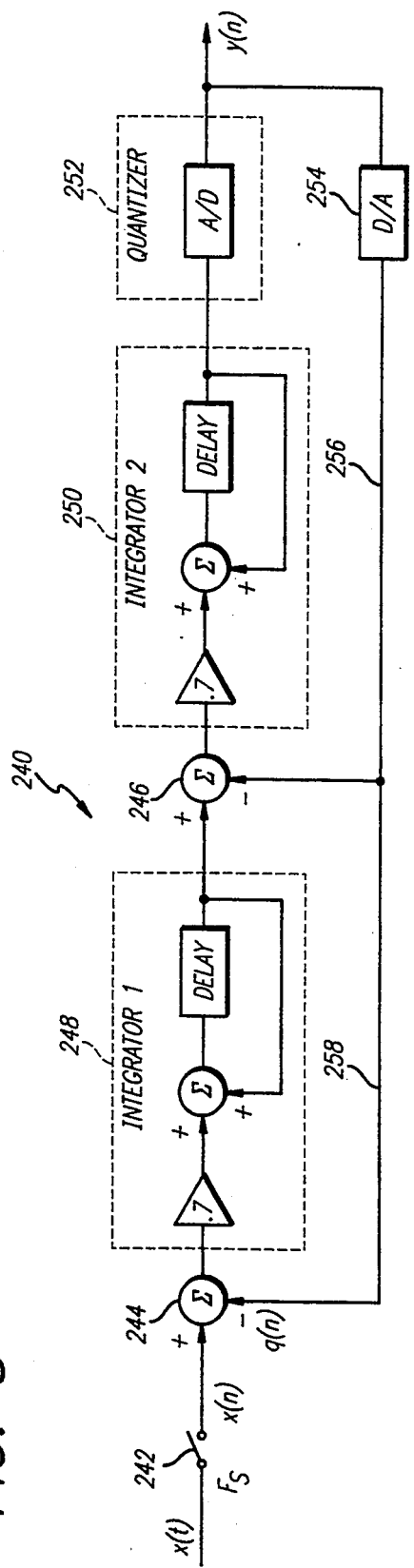
FIG. 8 presents a diagram of the architecture of the second order Sigma-Delta modulator of FIG. 7.
Figure 9A:
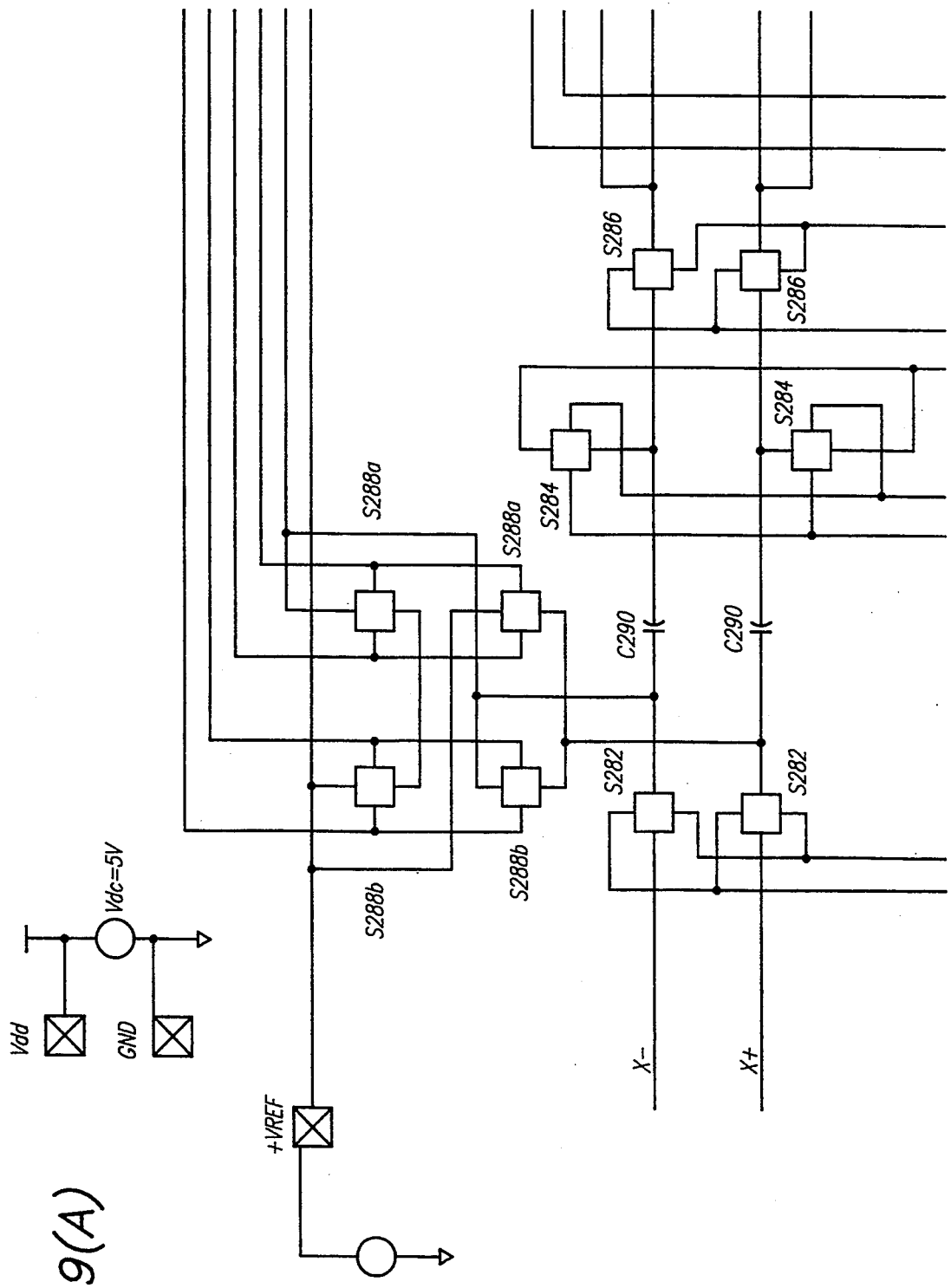
FIG. 9 presents the circuit implementation of the second order Sigma-Delta modulator of FIG. 8.
Figure 9B:
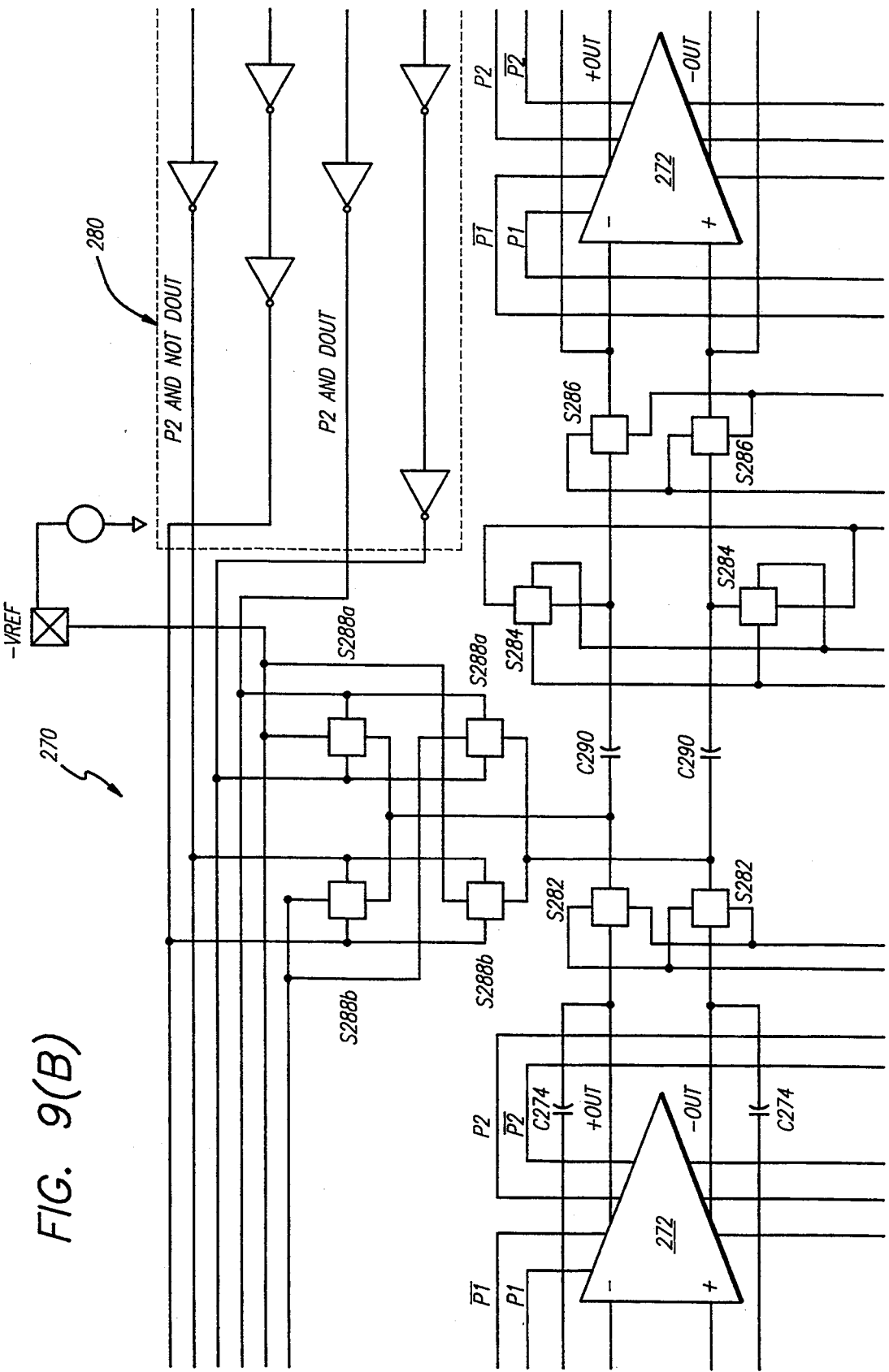
Figure 9D:
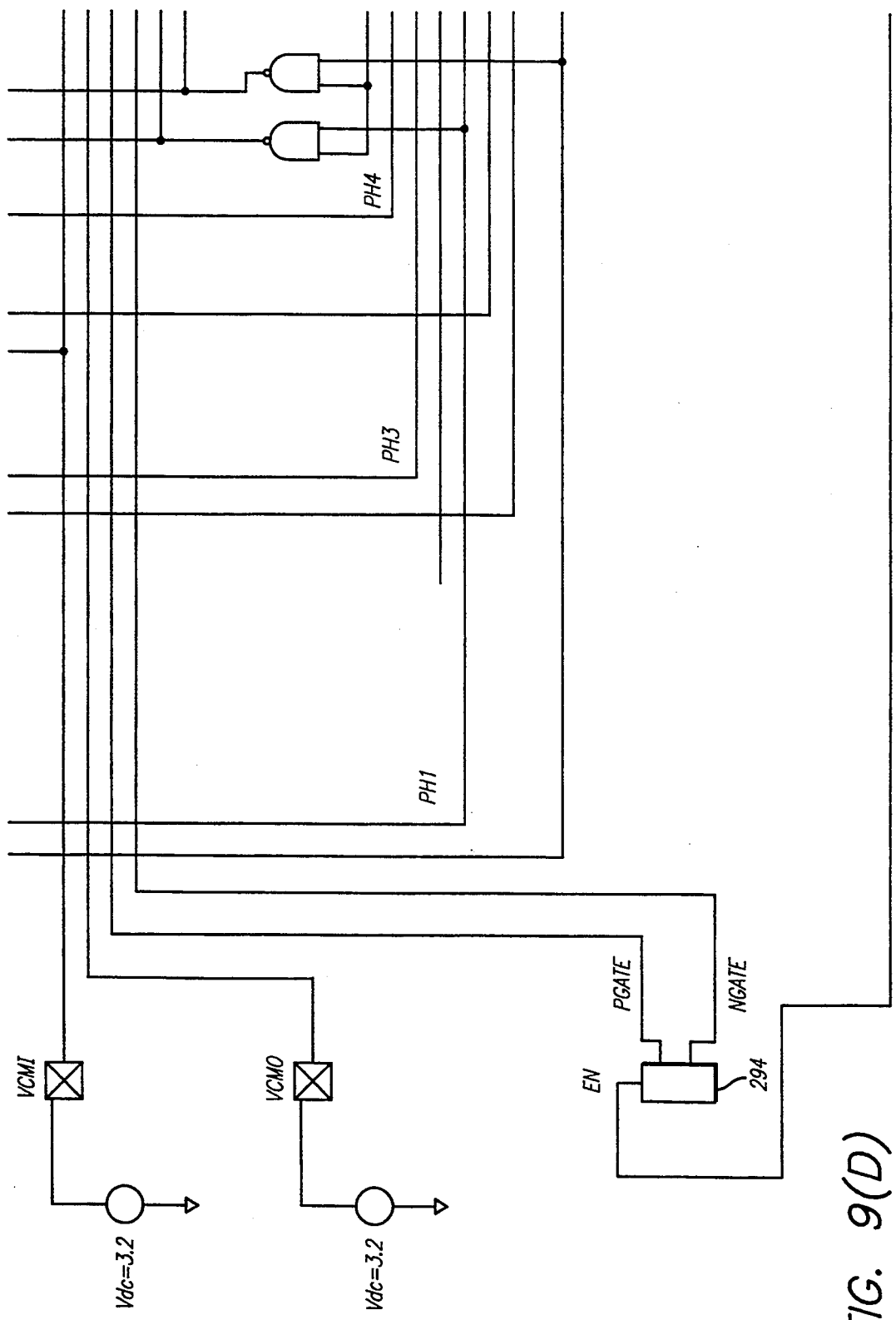
Figure 9E:
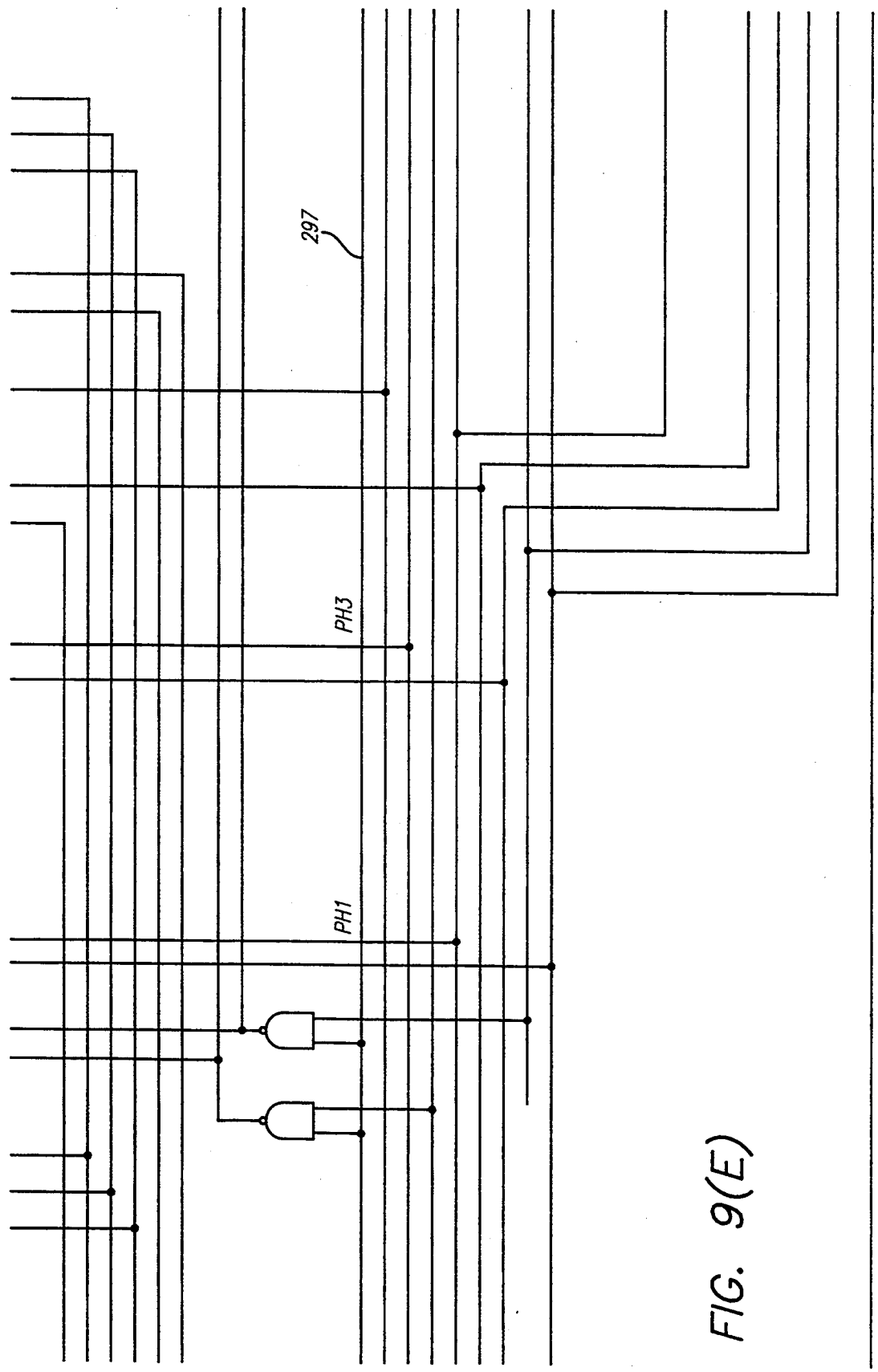
Figure 9F:
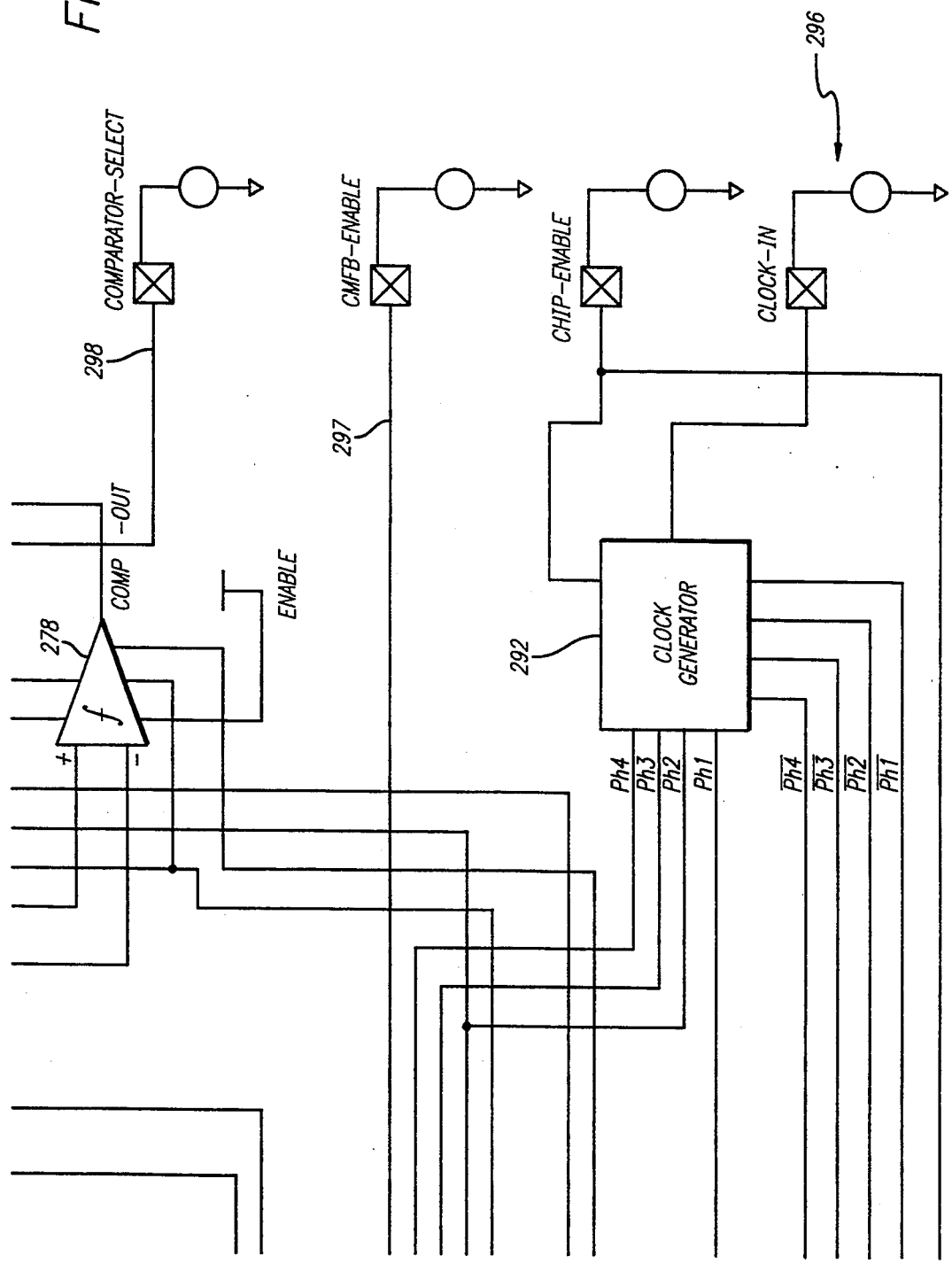

FIG. 8 presents a diagram of the architecture for the second order Sigma-Delta modulator of the present invention. Modulator 240 comprises sampler 242, difference nodes 244 and 246, integrators 248 and 250, one-bit quantizer 252, and one-bit D/A converter 254 in feedback paths 256 and 258. Sampler 242 samples modulator input x(t) at the oversampling frequency $F_S$. The differences between sampled input x(n) and output q(n) of D/A converter 254 (which is the analog representation of quantized output y(n)) is then supplied to integrator 248. In turn, the difference, between the output of integrator 248 (which is equal to seven tenths of its previous input plus its previous output) and output q(n) of D/A converter 254, is supplied to integrator 250. The output of integrator 250 (which is equal to seven tenths of its previous input plus its previous output) is then supplied to one-bit quantizer 252, which determines the value of output digital signal y(n) to be either (1) $+\Delta/2$ (where A is the quantizer step size) if the input to the quantizer is greater or equal to zero; or (2) $-\Delta/2$ if its input is less than zero.

As it is the case for first order Sigma-Delta modulator 10 of FIG. 1 and second order Sigma-Delta modulator 30 of FIG. 2, the impact of quantization error e(n) (i.e. the difference between the quantizer's output and the quantizer's input) on the resolution of the converter is dramatically reduced by the feedback loops. More precisely, due to feedback loops 256 and 258, this second order Sigma-Delta modulator performs a second order difference operation of the quantization error, which greatly attenuates the quantization noise at low frequencies by moving the noise energy to the higher frequencies. Consequently, even though quantization error e(n) at every sampling instance is large since a coarse one-bit quantizer is used, feedback loops 256 and 258 enable output signal y(n) to track the analog input signal x(t). Thus, the output of one-bit quantizer 252 can be averaged over several input sample periods (by the decimator as it was described above and as it further will be described below) to produce a very accurate result.

Figure 3:
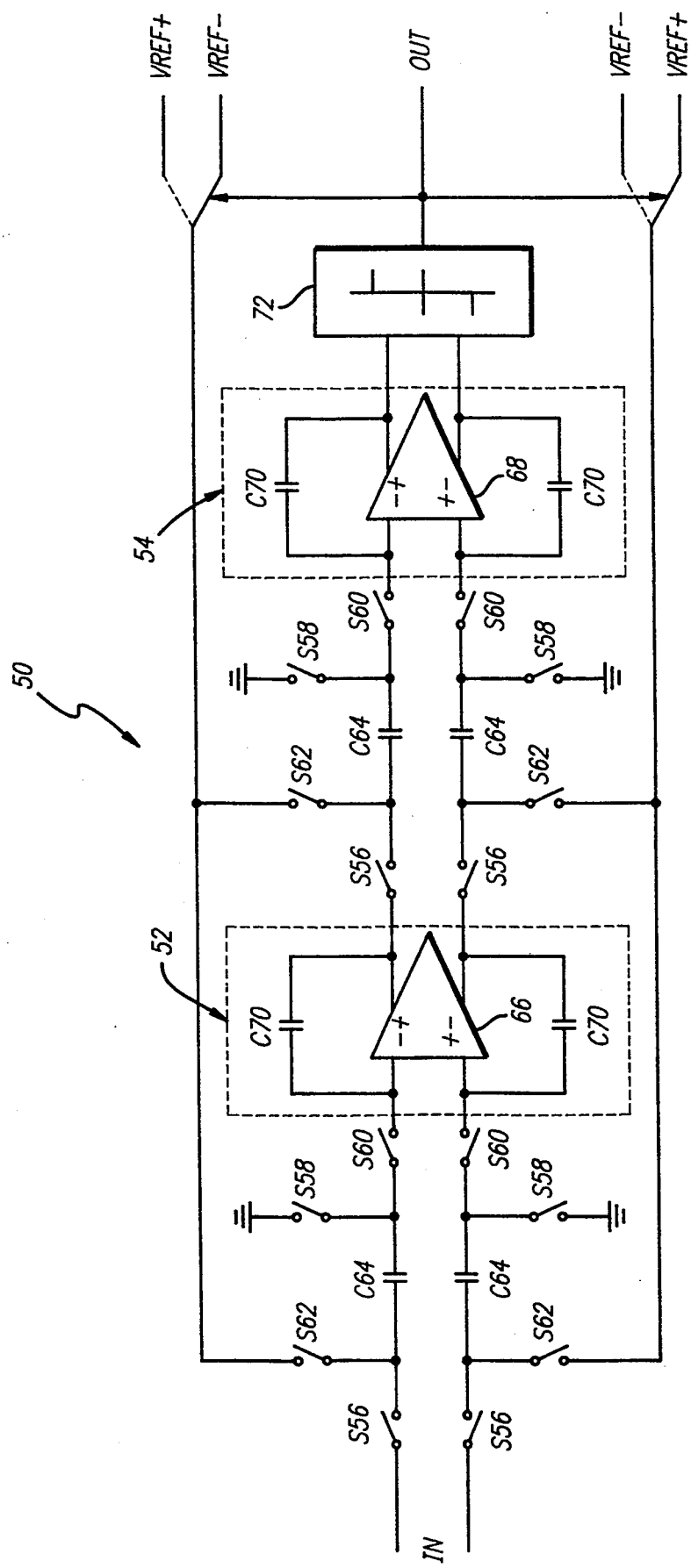
FIG. 3 presents the circuit implementation of the prior art second order Sigma-Delta modulator of FIG. 2.

Finally, it should be noted that the integration stages of second order Sigma-Delta modulator 240 have a gain of seven tenths, whereas the integration stage of prior art second order Sigma-Delta modulators have a gain of one half. For the Sigma-Delta modulators shown in FIGS. 2, 3, and 8 to be stable, the gain of each integration stage should not exceed one. In addition, due to non-ideal operating conditions, the gain of each integration stage is often lowered to one half in the prior art. However, the gain of each integration stage of modulator 240 can be as high as 0.7 without risking the stability of the modulator, because the analog components of the present invention are robust. In turn, the higher gain of each integration stage increases the dynamic range of the converter, since these higher gains increase the range of the signals that are provided to the comparator.

FIG. 9 presents the fully differential circuit implementation of the second-order Sigma-Delta modulator of FIG. 8. Modulator 270 comprises two integration stages (formed by amplifiers 272 and integrating capacitors C274), two comparators 276 and 278, one-bit D/A converter 280, eight sampling switches S282 and S284, four integrating switches S286, eight feedback switches S288a and S288b, four sampling capacitors C290, one clock pulse generator 292, and one current generator 294. In addition, the ratio of C274 to C290 is 0.7, in order to realize the 0.7 gain that precedes each integrator in the architecture of FIG. 8.

Figure 10:
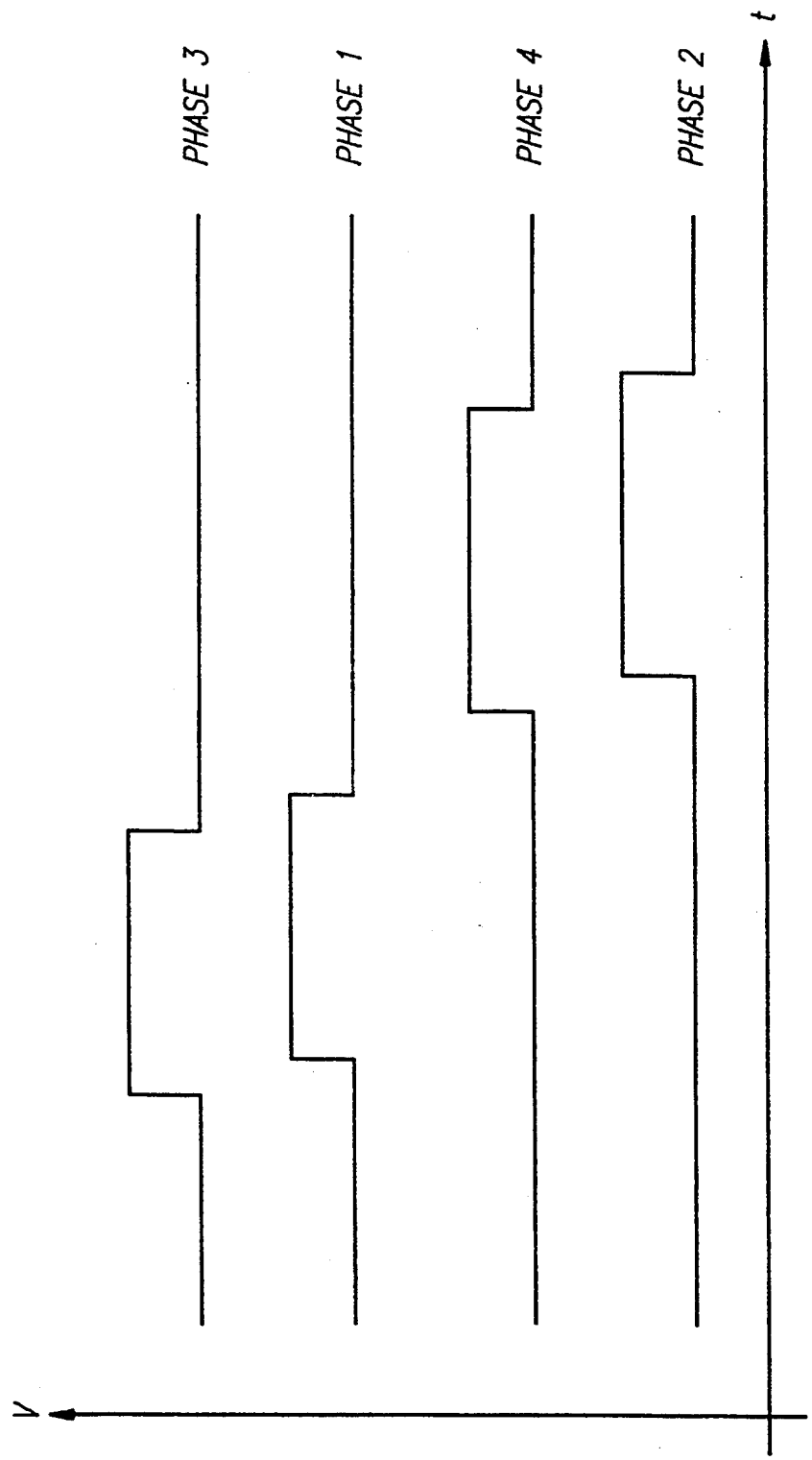
FIG. 10 presents a graph of the generated four phase clock signal used by second order Sigma-Delta modulator of FIG. 9.

The operation of modulator 270 is controlled by clock generator 292, which from master clock 296 produces a clock signal with two primary non-overlapping phases, each of which is comprised of two secondary over-lapping phases. More specifically, as shown in FIG. 10, clock generator 292 produces a four phase clock signal, where phase I (controlling switches S282) and phase 3 (controlling switches S284) are the two secondary overlapping phases that represent the first primary phase, and phase 2 (controlling switches S288) and phase 4 (controlling switches S286) are the two secondary phases that represent the second primary phase. The primary phases are non-overlapping, in order to avoid charge sharing problems. During the first primary phase, switches S282 and S284 are closed (switches are closed when their controlling clocks are high), while switches S288 and S286 are opened, and the input to each integrator is sampled onto capacitors C290.

Alternatively, during the second primary phase, switches S282 and S284 are opened while switches S286 and switches S288a or S288b are closed, and this switching arrangement causes the charges that were stored on capacitors C290 during the first primary phase to be partially transferred to capacitors C274. In addition, in the second primary phase, closed switches S288a or S288b subtract the output of the one-bit D/A network from the inputs of each integrator. More precisely, the operation of the feedback circuitry and one-bit D/A network 280 is as follows. When the output of the modulator is high, the feedback of the output of the modulator to the inputs of amplifiers 272 is performed by closed switches S288a, which supply $-V_{REF}$ to the negative inputs of the amplifiers and $+V_{REF}$ to the positive inputs of the amplifiers. On the other hand, when the output of the modulator is low, the feedback of the output of the modulator to the inputs of amplifiers 272 is performed by closed switches S288b, which supply $+V_{REF}$ to the negative inputs of the amplifiers and $-V_{REF}$ to the positive inputs of the amplifiers. Furthermore, during the first primary phase, comparators 276 and 278 each quantize the sampled input signal. During the second primary phase, both comparators reset and, depending on comparator select signal 298, the output of one of the comparators is chosen to represent the output of modulator 270. Consequently, with this clocking arrangement, the time available for the integration and the time for the comparison are both one-half of a clock cycle.

The charge injected by the MOS switches in the circuit is a common-mode signal, which is canceled by the differential implementation of the modulator. Signal dependent charge injection is further suppressed by opening switches S284 and S286 slightly before switches S282 and S288 respectively. Since switches S284 and S286 are connected to either a ground or virtual ground node, they do not exhibit signal dependent charge injection. Once switches S284 or switches S286 have opened, and before the other set of switches have closed, capacitors C290 is floating; thus, the subsequent opening of switches S282 or S288 during the interval when both sets of switches S284 and S286 are open will, to a first order, not inject charge onto capacitors C290.

Figure 11A:
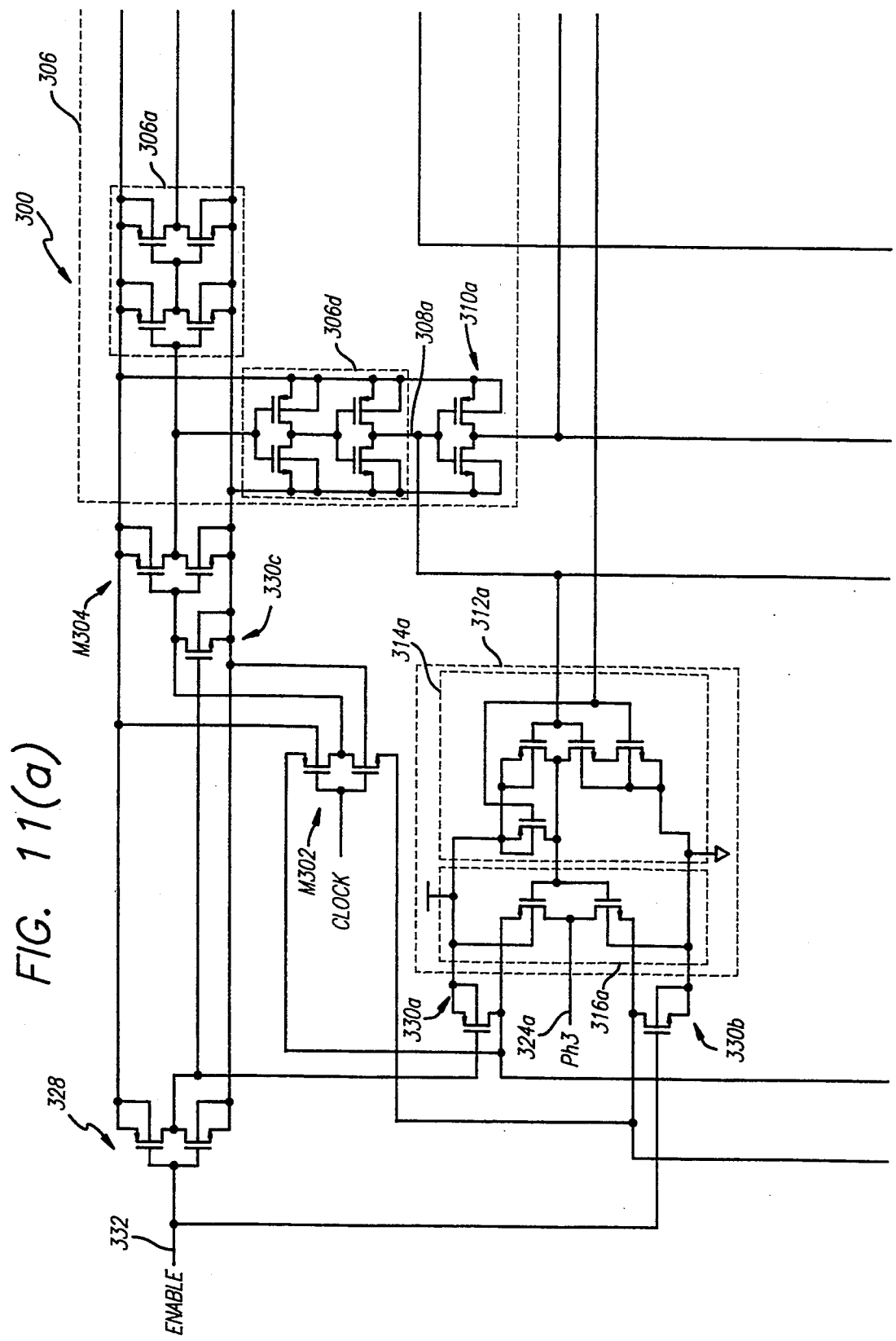
FIG. 11 presents a circuit diagram of the four phase clock pulse generator.
Figure 11C:
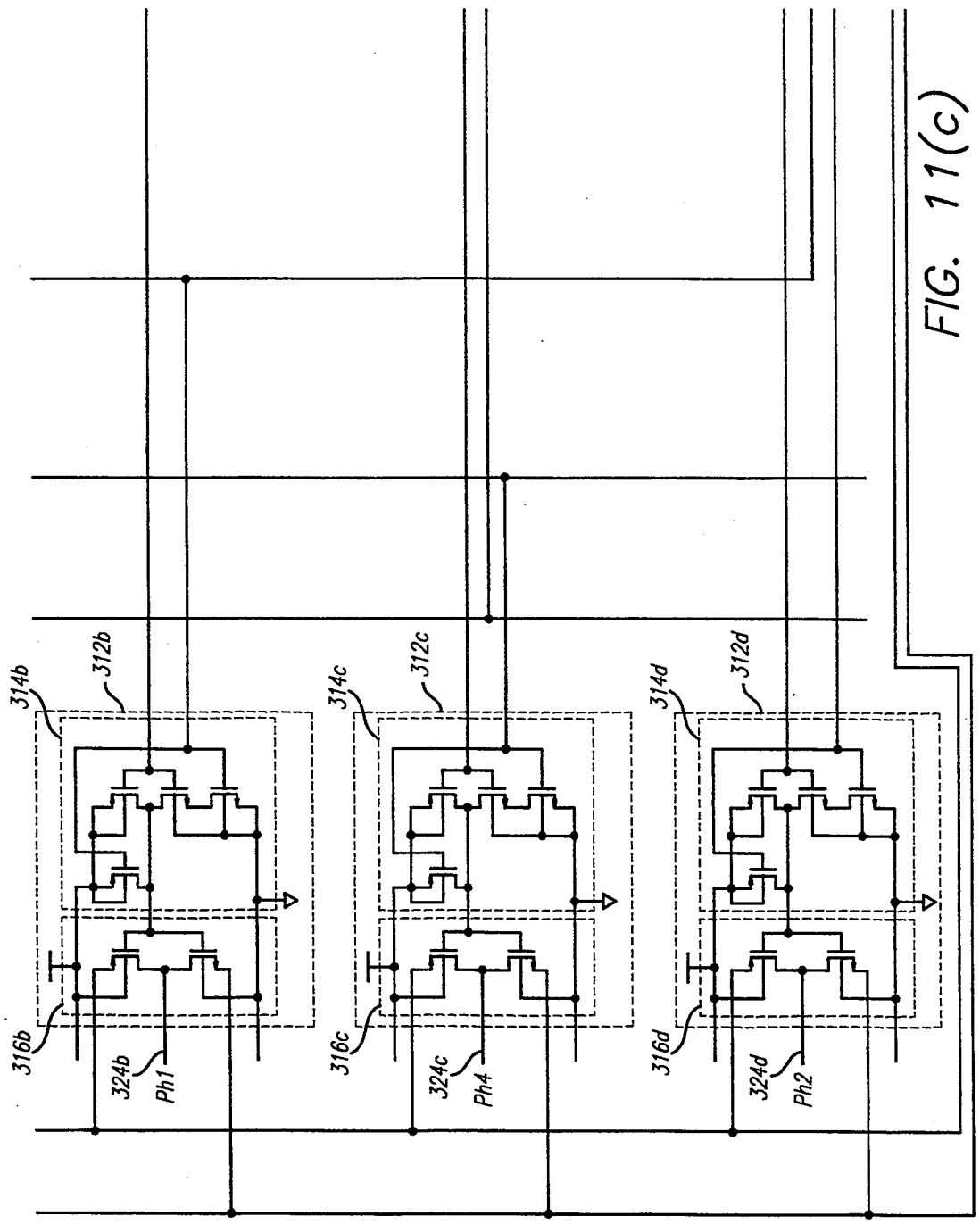
Figure 11D:
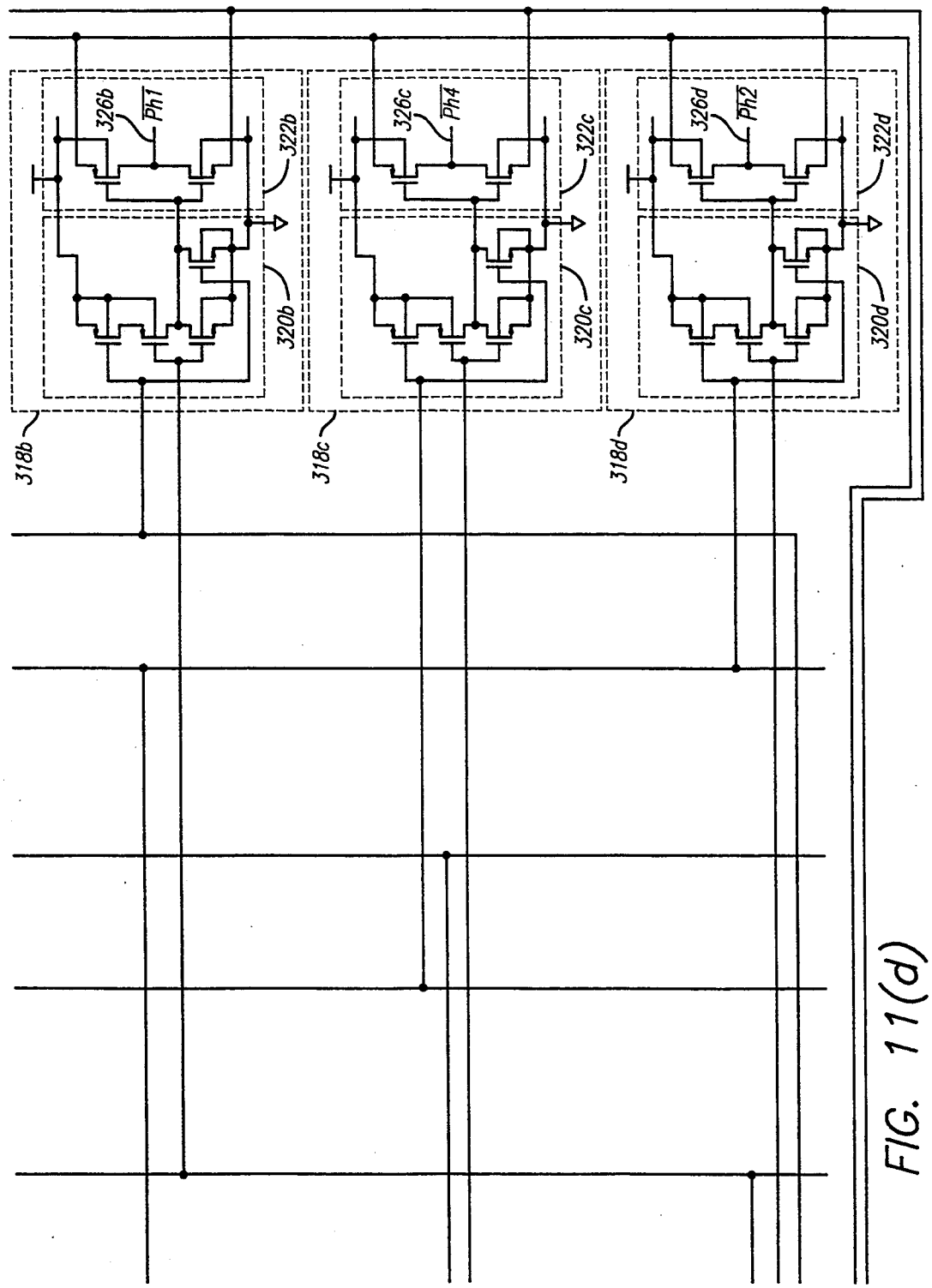

FIG. 11 presents the circuit diagram of one embodiment of clock pulse generator 292 of FIG. 9. The master clock signal is supplied to the gate of first driver inverter 302, which in turn supplies an inverted version of the master clock signal to the input of second driver inverter 304. The output of second driver 304, which is a delayed version of the master clock signal, is then supplied to delay circuitry 306. This delay circuitry has seven delaying elements 306a–306g, each of which comprises two inverters. The delay of each delaying element is dependent on the device sizes.

Consequently, due to these delaying elements, four delayed version of the master clock signal appear at nodes 308a–308d. In turn, from these four delayed versions and their inverted counterparts (i.e. the four delayed versions are inverted by inverters 310a–310d), the four phases can be generated. More specifically, the phases are generated by supplying the delayed versions of the master clock to AND gates 312a–312d (formed by NAND gates 314a–314d and inverters 316a–316d) and OR gate 318a–318d (formed by NOR gates 320a–320d and inverters 322a–322d). For example, assuming that the delay of each delaying element is 5 ns, and that the delays attributable to driver inverters 302 and 304 are negligible, phase 3 is a pulse that is generated when both the of the master clock's 5 ns delayed version (appearing at node 308a) and 15 ns delayed version (appearing at node 308c) are at the high logic level. Thus, clock pulse generator 292 generates the four phases (phase 1 through phase 4, which are shown in FIG. 10) at nodes 324a–324d, and the inverted versions of these four phases at nodes 326a–326d. Finally, clock pulse generator 300 has disabling inverter 328 and disabling transistors 330a–330c for disabling the clock pulse generator; when enable signal 332 goes low, transistor 330c disables delaying circuitry 306, while transistor 330a and 330b disable AND gates 312 and OR gates 318.

a. Amplifiers

Figure 12A:
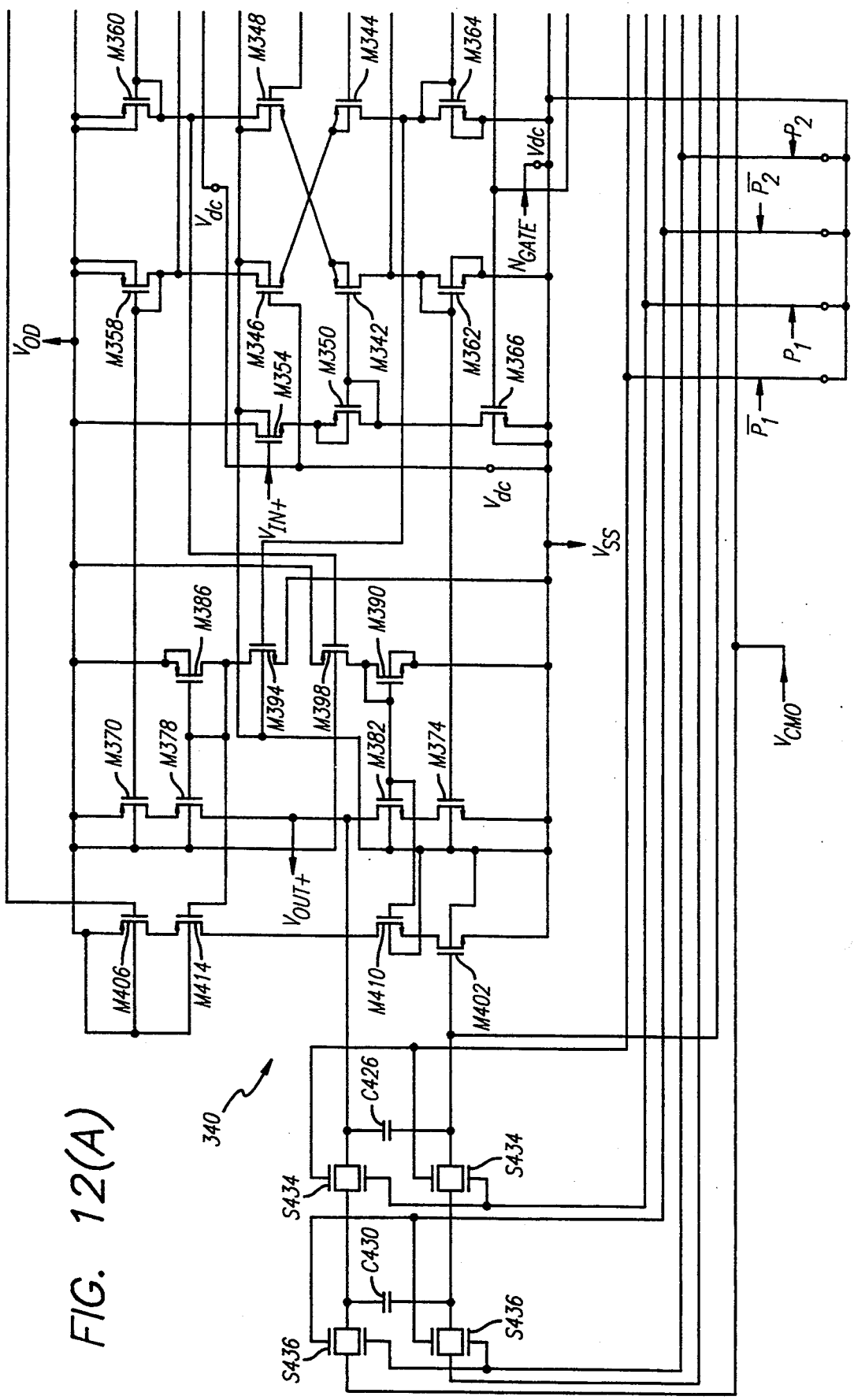
FIG. 12 presents the circuit diagram of the operational amplifier used in the second order Sigma-Delta modulator of FIG. 9.
Figure 12B:
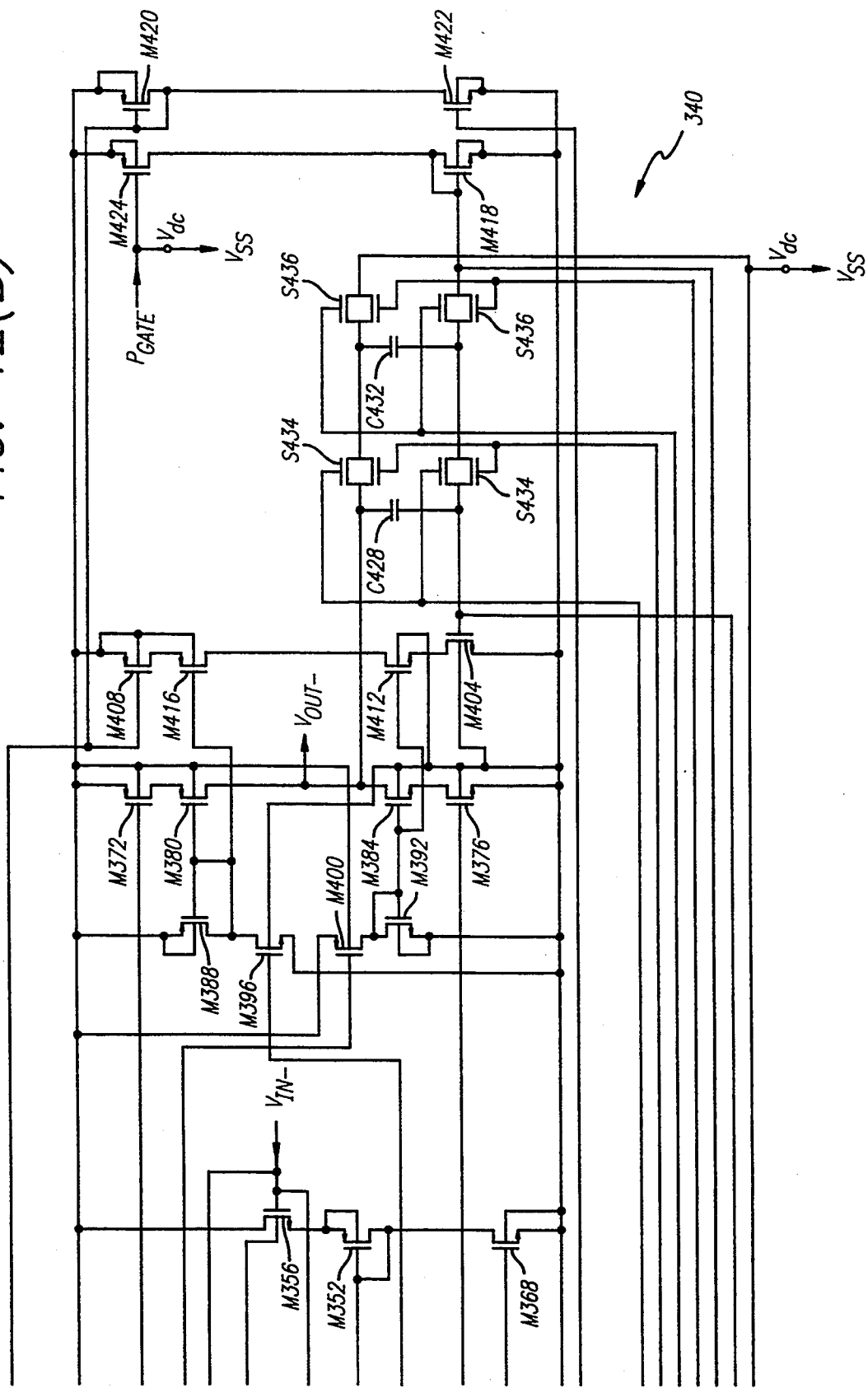

FIG. 12 presents the circuit diagram of operational amplifier 272 used in second order Sigma-Delta modulator 270 of FIG. 9. For several reasons, operational transconductance amplifier 340 (i.e. OTA 340) was chosen to implement amplifier 272. First, an operational transconductance amplifier (i.e. an amplifier which transforms an input voltage to an output current) was chosen, in order to simplify the common-mode feedback circuitry. In implementing the common mode feedback circuitry, a high output impedance amplifier (such as an OTA) is useful, since a low output impedance amplifier would overdrive the load impedance presented by the common-mode feedback circuitry. In other words, the high output impedance of an OTA simplifies the common-mode feedback circuitry, since the feedback circuitry can simply adjust the output of the OTA by manipulating the output currents of the OTA. Second, OTAs are also advantageous since their gains are a function of the load resistance. Third, OTA 340 was chosen to implement amplifiers 272 of FIG. 9, since OTA 340 is a class AB amplifier (i.e. an OTA that supplies all of its output current to the load devices) and thus has a high power efficiency, slew rate, and signal recovery ratio.

Transistors M342–M364 make up the input stage of this amplifier. The input stage is driven by N-channel MOS transistors M346 and M348, since the differential input voltage signals ($V_{IN+}$ and $V_{IN-}$) are applied to the gates of these two transistors. Consequently, since N-channel transistors are faster than P-channel transistors, this NMOS driven input stage of OTA 340 is superior to, and more responsive to changes in the input signal than, the PMOS driven input stage of prior art OTA 80 of FIG. 4.

Transistors M350–356 of the input stage realize the level shift necessary to bias M342–M348. In addition, current source 294 of FIG. 9 (which, as it will be described below, is independent of changes in process and supply voltage, while being slightly dependent on changes in temperature) establishes the bias currents that flow through transistors M350–M356 and thus establishes the quiescent current of the amplifier, by mirroring the current in its output stages into NMOS transistors M366 and M368. In turn, provided that cross coupled input transistors M342–M348 operate in the saturation region, the drain currents of these input stage transistors are proportional to the square of the input voltage.

Furthermore, the current in the input stage is mirrored (by the current mirrors formed by transistors M362 and M374, M364 and M376, M360 and M372, and M358 and M370) into the output stage of the amplifier, where transistors M370, M378, M382, and M374 form the positive differential output stage and transistors M372, M380, M384, and M376 form the negative differential output stage. The cross coupling of the input driving transistors M342-M348 enables OTA 340 to operate as a class AB amplifier, which in turn improves the slew rate and power consumption efficiency of the OTA. For example, when the input at $V_{IN+}$ is lower than the input at $V_{IN-}$, transistors M360, M348, M342, and M362 turn on the N-channel output devices (M374 and M382) of the positive output stage and the P-channel output devices (M372 and M380) of the negative output stage, while transistors M358, M346, M344, and M364 turn off P-channel output devices (M370 and M378) of the positive output stage and the N-channel output devices (M376 and M384) of the negative output stage. In addition, the cross coupling of the input driving transistors increases the gain of OTA 340 by 6 dB, since it enables both the N-channel and the P-channel output devices to be active. For example, as mentioned above, when input at $V_{IN+}$ is lower than input at $V_{IN-}$, the input stage transistors turn on transistors M374 and M382 while turning off transistors M370 and M378. Thus, since both the N-channel and the P-channel output are active (i.e. responsive to changes to the input signal), both sets of output devices drive the load impedance by providing a push and pull effect, and thereby increase the gain of OTA 340 by a factor of two (which translates into a 6 dB increase in the gain).

The gain of the amplifier is also increased by using cascode transistors M378-M384 in the output stages, since they increase the output impedance. In addition, dynamic biasing transistors M386-M400 dynamically bias these cascode devices according to the desired output current levels. In turn, this dynamic biasing technique greatly increases the signal range at the output of the amplifier. Dynamic biasing also provides faster AB operation, and thus increases the slew rate and power consumption of the OTA 340. More specifically, with dynamic biasing, the biasing current flowing through the output stage transistors is dependent on the current flow through the input stage transistors. Therefore, dynamic biasing allows the current flow in a particular set of output devices to be terminated, even when current flows through the corresponding input stage transistors. For example, even when current flows through transistors M358, M346, M344, and M364, the current flow through output stage transistors M376 and M384 can be prevented if the gate voltage of transistor M392 decreases below the sum of threshold voltage $V_T$ of M384 and saturation voltage $V_{SAT}$ of M376; the gate voltage of transistor M392 decreases below $V_T+V_{SAT}$ when the voltage at the gate of transistor M346 reduces current flow through M392 and M400, by reducing the current flow through M358, M346, M344, and M364.

Since OTA 340 is driven by NMOS transistors M346 and M348, the gain and current drive of OTA 340 are also increased by making the common-mode input and output voltages (i.e. the operational input and output biasing points) equal to 3.2 volts, and (2) by preventing variations in power supply voltage, input voltage, operating temperature, and process (i.e. transistor conductance parameters) from changing these common-mode voltages. The optimal biasing points maximize the gain and the current drive of OTA 340, because they maximize the linear operating range of the devices and thus maximize the output signal swing of OTA 340. OTA 340 places and maintains the operational biasing points close to their optimal values in several manners. First, the input stage of OTA 340 prevents the DC level of the input signals from changing the common-mode input voltage of OTA 340, since it is a differential input stage. In other word, differential input transistors M342-M348 filter out the DC voltage level of the input signals by only amplifying the differences between the differential input signals. Second, the linear range of operation and the gain of OTA 340 are maximized by selecting the optimal sizes for the devices of OTA 340, and these sizes are set forth below in Table 1.

TABLE 1

| Transistor | Length (μM) | Width (μM) | Transistor | Length (μM) | Width (μM) |
|---|---|---|---|---|---|
| M342 | 1.2 | 325 | M344 | 1.2 | 325 |
| M346 | 2.2 | 324.8 | M348 | 2.2 | 324.8 |
| M350 | 1.2 | 325 | M352 | 1.2 | 325 |
| M354 | 2.2 | 324.8 | M356 | 2.2 | 324.8 |
| M358 | 1.2 | 50 | M360 | 1.2 | 50 |
| M362 | 2.2 | 50.4 | M364 | 2.2 | 50.4 |
| M366 | 4.2 | 100 | M368 | 4.2 | 100 |
| M370 | 1.2 | 50 | M372 | 1.2 | 50 |
| M374 | 2.2 | 45 | M376 | 2.2 | 45 |
| M378 | 1.2 | 50 | M380 | 1.2 | 50 |
| M382 | 2.2 | 45 | M384 | 2.2 | 45 |
| M386 | 1.2 | 5 | M388 | 1.2 | 5 |
| M390 | 2.2 | 5 | M392 | 2.2 | 5 |
| M394 | 2.2 | 30 | M396 | 2.2 | 30 |
| M398 | 1.2 | 30 | M400 | 1.2 | 30 |
| M402 | 2.2 | 25 | M404 | 2.2 | 25 |
| M406 | 1.2 | 25 | M408 | 1.2 | 25 |
| M410 | 2.2 | 25 | M412 | 2.2 | 25 |
| M414 | 1.2 | 25 | M416 | 1.2 | 25 |
| M418 | 2.4 | 50 | M420 | 4.2 | 100 |
| M422 | 2.4 | 50 | M424 | 4.2 | 100 |

Third, current generator 294 of FIG. 9 maximizes the linear region of operation and the gain of OTA 340, by establishing the optimal common mode voltages and by preventing these common mode voltage from varying with process, supply voltage, and temperature (i.e. from varying with PVT). More precisely, current generator 294 mirrors a reference current that is invariant to changes in process and voltage (i.e. that is PV invariant) into transistors M366 and M368. In addition, the mirrored reference current of current generator 294 varies slightly with temperature, in order to offset the effects due to temperature on the common mode voltages and the gain of OTA 340.

Figure 13:
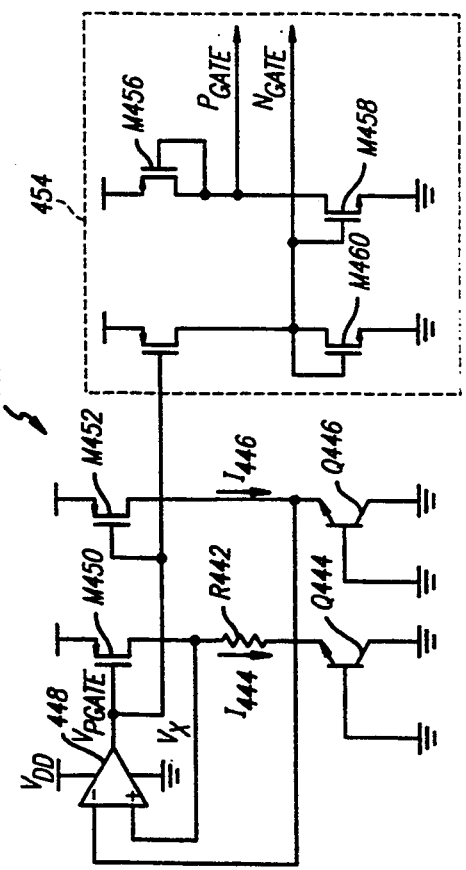
FIG. 13 presents the circuit diagram of the current generator used by the operational amplifier of FIG. 12.

One embodiment of current source 294 is presented in FIG. 13. In typical MOS processing, only one active device exhibits easily predictable operating characteristics, that being the bipolar junction diode. The predictable characteristics of the bipolar junction diode used in conjunction with normal resistors available in MOS processing are the building blocks used to form current source 440. More precisely, this current source uses a PTAT (proportional to absolute temperature) technique (which is a variation of the bandgap reference-i.e. $\Delta V_{BE}$--technique) to generate a reference current value through resistor R442. In FIG. 13, identical currents pass through two diode connected bipolar transistors Q444 and Q446 (which are parasitic PNP junctions produced in the MOS processing), that have emitter areas which are ratioed with respect to each other by a factor of X. This biasing will cause a $\Delta V_{BE}$ drop between the emitter voltages ($V_{BE444}$ and $V_{BE446}$) which is forced to be dropped across resistor R442, by means of operational amplifier 448 that causes $V_X$ to equal $V_{BE446}$.

This system is accomplished by having output $V_{PGATE}$ of operational amplifier 448 set the $V_{GS}$ of two identical PMOS devices M450 and M452, which establish identical biasing currents (I444 and I446) through transistors Q444 and Q446. Current I444 (which is reference current $I_{REF}$) equals the $\Delta V_{BE}$ drop across resistor R442 divided by the resistance of resistor R442. Consequently, since $V_{BE} = (kT/q)*\ln X$ and $I_{REF}(T) = (kT/q)*\ln X*(1/R(T))$, current $I_{REF}$ is not dependent on the power supply voltage or the transistor conductance parameters; hence, the requirements that the biasing current be PV intolerant is satisfied. To complete the requirements for the PVT intolerance of OTA 340, $I_{REF}$ must be slightly dependent on the operating temperature, in order to offset the temperature effects on the common mode voltages and thus the gain of the OTA; specifically, $I_{REF}$ is chosen to be proportional to the temperature in order to counteract the inverse dependency of the gain of OTA 340 on the temperature. The exact temperature dependence of reference current $I_{REF}$ can be established about a temperature, by setting the derivative of reference current $I_{REF}$ with respect to the temperature equal to the desired value. For example, maximum flatness of the temperature curve of $I_{REF}$ at a temperature of 300° K. can be achieved by selecting a resistor with a temperature coefficient of +3300 PPM per ° C.

Since the current reference is frequency stable as long as $V_{PGATE}$ is not used directly to bias other active circuits, $V_{PGATE}$ is supplied to output mirroring stage 454 of current source 440. Gate voltages $P_{GATE}$ and $N_{GATE}$ (generated at gates of transistors M456 and M460) provide both source and sink capability and supply the VGS potential needed to further mirror $I_{REF}$ to the biasing devices (M366, M368, M422, and M424) of OTA 340. These mirroring output stages were developed without control of the $V_{DS}$ of the devices, relying only on long channels to control current modulation in these devices. For $V_{DD}$ above 5V, a full cascoding scheme needs to be employed throughout the reference system. In addition, the sizes of the devices in output mirroring stage 454 and the magnitude of reference current $I_{REF}$ were chosen to realize 15 μA biasing currents in OTA 340; the biasing currents are relatively small in order to maximize the gain of the amplifier. Furthermore, resistor R442 was created from a composition of two resistive materials, one of TC greater than +3300 PPM per ° C. and the second with TC less than +3300 PPM per ° C. More precisely, the resistor was composed of p+ diffusion with TC of +1300 PPM per ° C. and n-well diffusion with TC of +6100 PPM per ° C. Finally, in order to insure the start up of the system, a simple start up circuit must be employed.

Fourth, a common mode feedback circuitry (transistors M402-M424, capacitors C426-C432, switches S434 and S436) maximizes the linear operating range of OTA 340 (and thus maximizes the gain and current drive of the OTA) by optimally biasing OTA 340 and by preventing the optimal biasing point from varying. The common mode feedback circuitry is based on sampling the differential output signals using switched capacitor techniques. Since OTA 340 is used to realize amplifier 272 of FIG. 9, only a small amount of offset current is required to rebias the output stages as the output stages of an OTA are current sources. Thus, because current sources have a high output DC impedance, injecting a small current or removing a small current will cause a relatively large shift in the output voltage of an OTA.

Due to the particular device sizes of OTA 340, the linear range of operation is maximized when the common mode output voltage equals 3.2 volts. Selecting the common mode output voltage to equal the common mode input voltage (i.e. 3.2 volts) is also beneficial, since it enables continuous operation of OTA 340 when the common mode feedback circuitry is disabled. The common mode voltage of amplifier outputs $V_{OUT+}$ and $V_{OUT-}$ is set by the current flowing through transistors M402 and M404. The voltage at the gates of these transistors is set initially by biasing circuits formed by transistors M418–M424, where M422 and M424 acts as current sources that have reference current $I_{REF}$ of current source 440 of FIG. 13 mirrored into them. The common mode feedback circuitry of the present invention uses two transistors M422 and M424 as current sources in order to enable lower voltage operation and to provide for independent control of the P-channel and the N-channel MOS devices in the feedback circuitry.

Furthermore, the gates of transistors M402 and M404 are controlled by the midpoint of the voltage divider consisting of capacitors C426 and C428, which have equal values. These capacitors sense the common-mode output of the amplifier and at the same time provide the voltage level shift necessary to set the operating point of M402 and M404. More precisely, a change in the amplifier's differential output voltage is equally distributed across capacitors C426 and C428 and leaves the voltage at the gates of transistors M402 and M404 unchanged; however, any common mode change in the output is coupled directly to the gate voltage of transistors M402 and M404, which drives the common mode output voltage to the desired levels through negative feedback.

In addition, the purpose of capacitors C430 and C432 is to periodically restore the voltage drop across capacitors C426 and C428, in order to compensate for the drift in the common-mode output voltage due to charge leakage. Therefore, when P2 is high (when phase two and common mode feedback enable signal 297 are high) capacitors C430 and C432 charge up to the desired common mode output voltage $V_{CMO}$ (which as mentioned before is about 3.2 volts, in order to optimize the dynamic range of the amplifier output, to enable low voltage operation, and to improve power supply noise rejection). In turn, when P1 is high (when phase one and common mode feedback enable signal 297 are high) capacitors C430 and C432 transfer charges to capacitors C426 and C428, in order to enable capacitors C426 and C428 to realize the correct voltage shift. Cascode transistors M410–M416 are included in the common mode feedback circuitry in order to increase the output impedance of the common mode feedback circuitry, which prevents the degradation of the gain of the amplifier. Also, these cascoded transistors are dynamically biased in order to improve the power consumption of OTA 340.

The common mode feedback circuitry also can be disabled by pulling common mode feedback enable signal low. For the embodiment of the amplifier of the present invention that is shown in FIG. 12, the common mode feedback circuitry can be disabled because the linear operating range of OTA 340 is sufficiently maximized by the differential input stage, the current generator, and the optimal device sizes. Disabling the common mode feedback circuitry is advantageous because it decreases the power consumption, decreases the noise generated by the feedback circuitry, increases the dynamic range of the modulator, and increases the speed of the amplifier.

Finally, two other aspects of OTA 340 of FIG. 12 should be noted. First, in order to obtain five volt operation for OTA 340, device sizes are optimized. In addition, five volt operation is obtained by using body effect compensation techniques, where the bulk of the P-channel devices are tied to their sources in order to cancel the back bias contribution to the body effect; in turn, the cancellation of the back bias contribution reduces the effective threshold of the devices and thus allows lower voltage operation. Second, OTA 340 was designed to have zero degrees of phase margin at the unity gain bandwidth into a 10 pf capacitive load, which is not normally done because of the possibility of instability. However, in the present case, since the load devices are totally capacitive and predictable, OTA 340 could be designed for zero degrees phase margin at unity gain. This design choice in turn allows lower voltage operation, since the amplifiers are faster.

Figure 14:
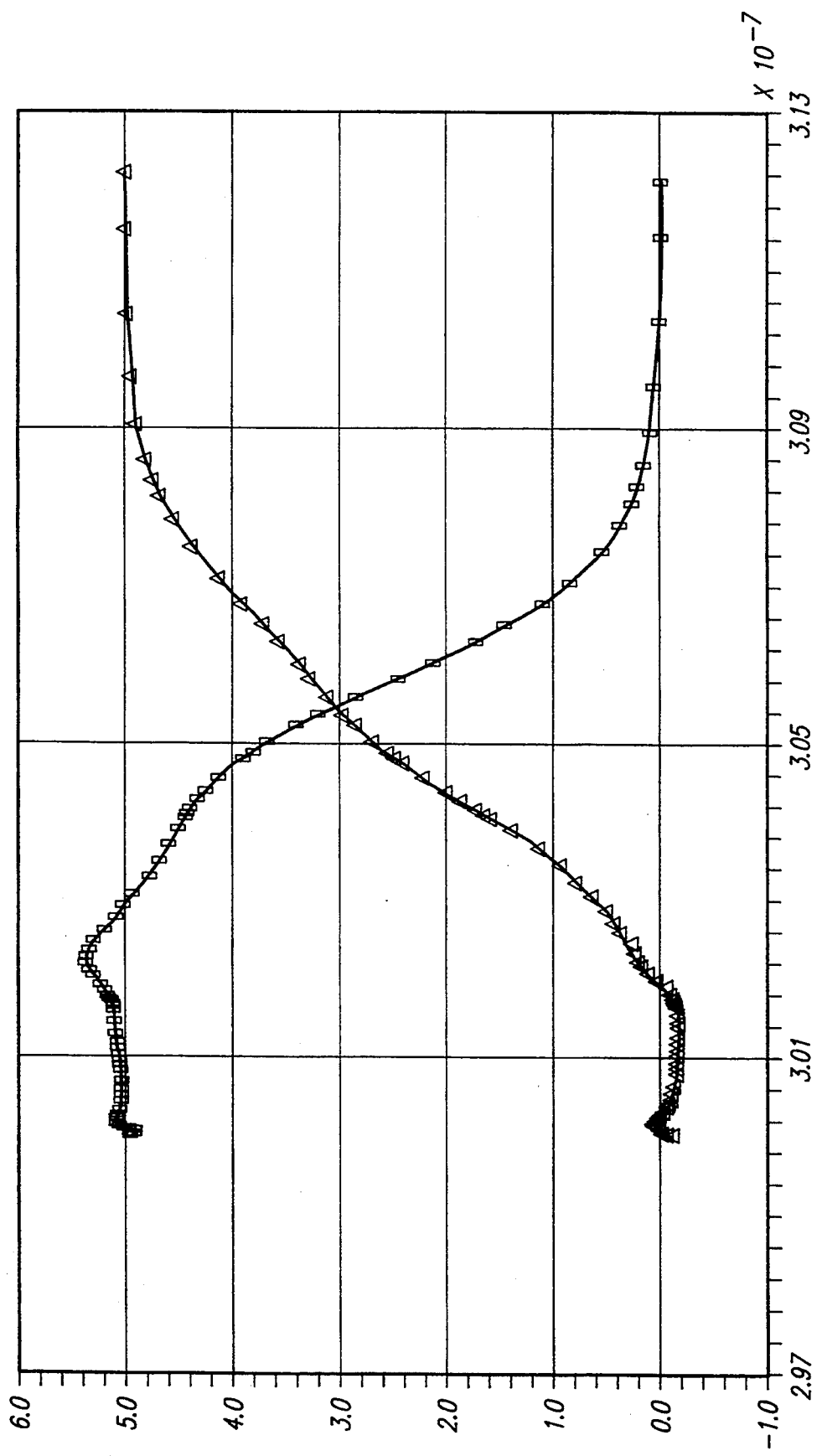
FIG. 14 presents a graph of the step response of the operational amplifier of FIG. 12.
Figure 15:
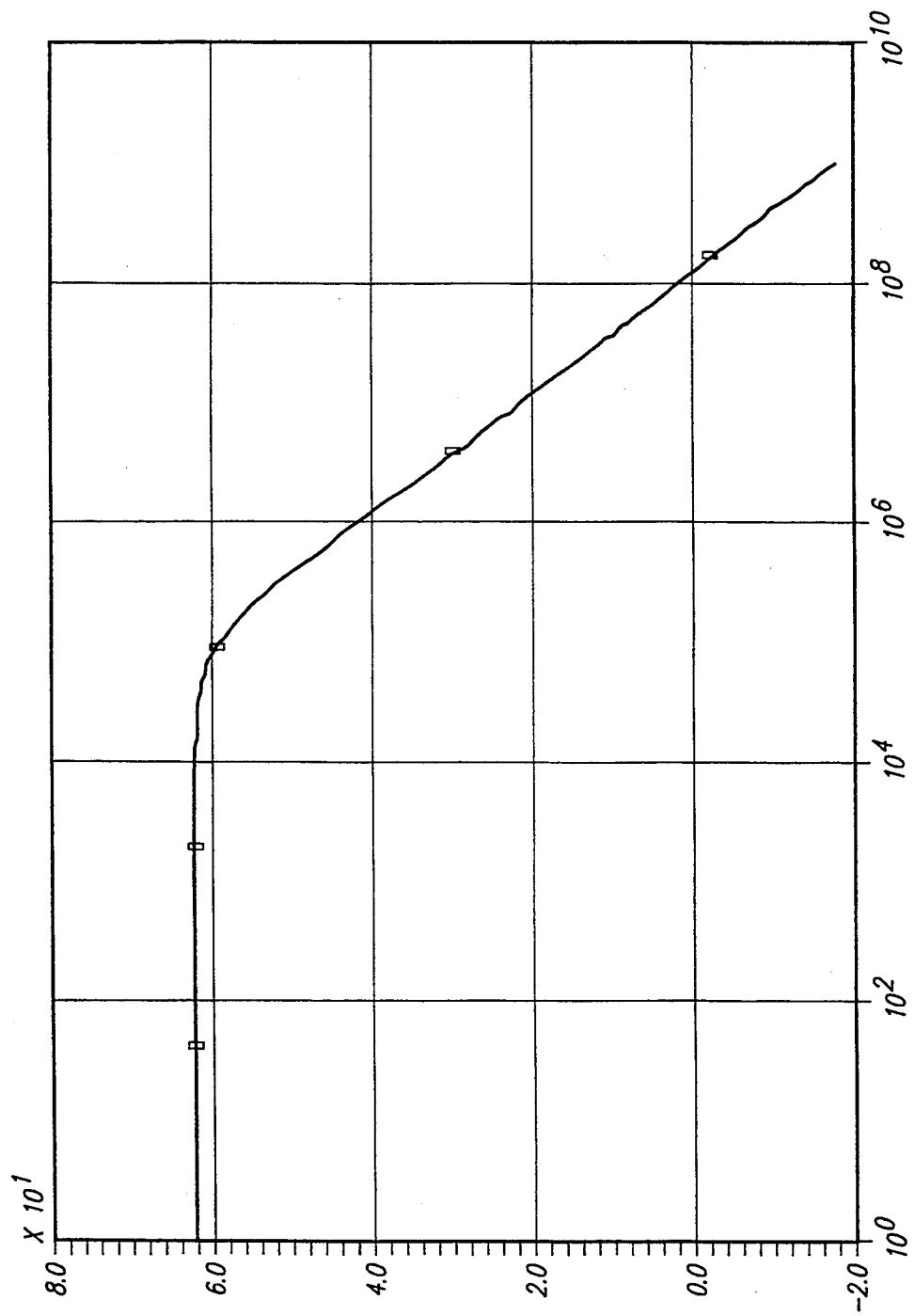
FIG. 15 presents a graph of the open loop gain of the operational amplifier of FIG. 12.
Figure 16:
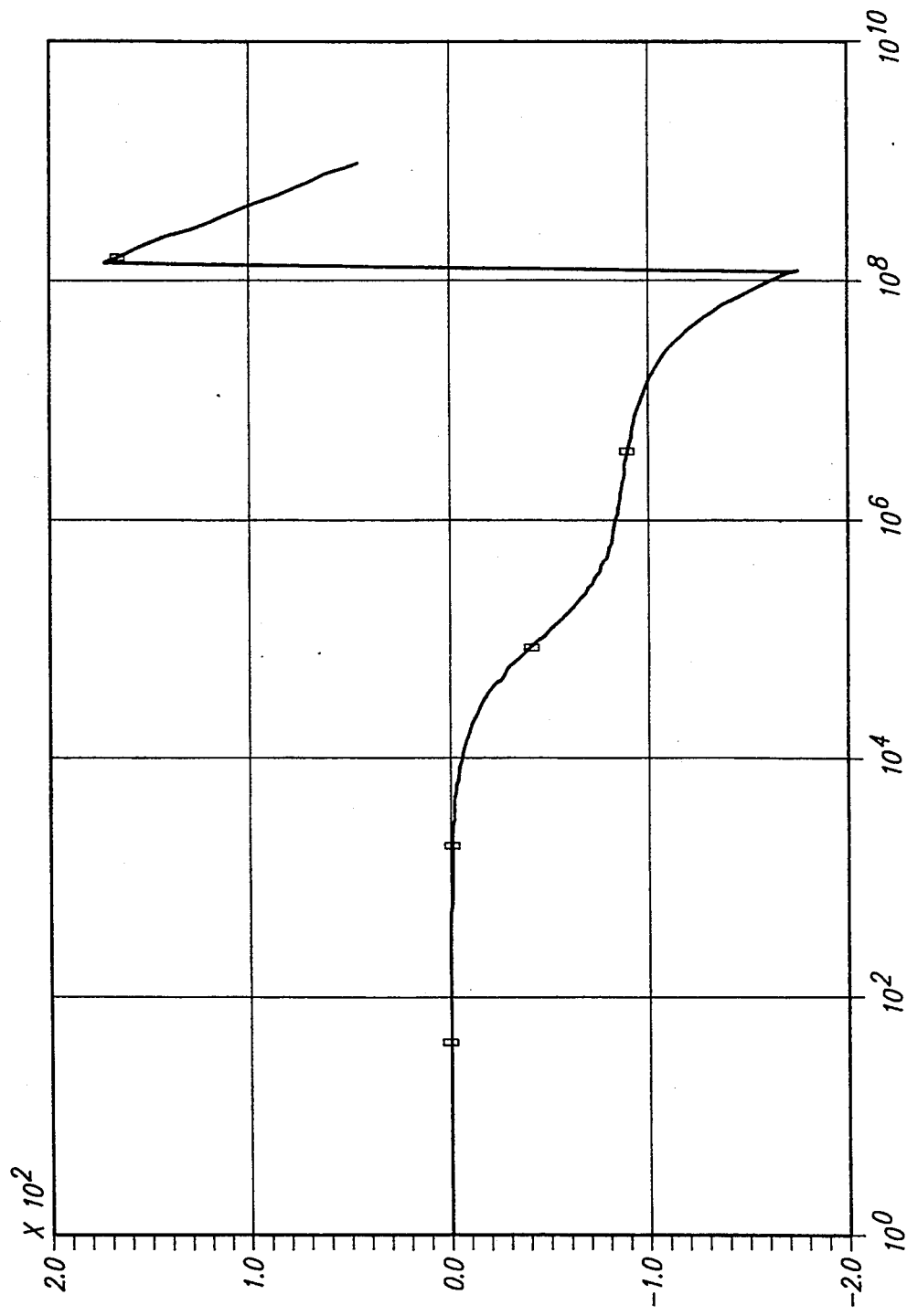
FIG. 16 presents a graph of the phase margin of the operational amplifier of FIG. 12.

OTA 340 of FIG. 12 easily satisfies the stringent requirements, due to the high oversampling ratio, for amplifier 272 of second order Sigma-Delta modulator 270 of FIG. 9. For example, when OTA 340 is realized by using a 1.2 $\mu$M process, the slew rate of the amplifier is 1000V/$\mu$s, which is well over the slew rate requirement of 300V/$\mu$s. The effect of this slew rate can be recognized by observing the step response plot of OTA 340 that is shown in FIG. 14. In addition, the unity gain bandwidth of OTA 340 is approximately 200 MHz, which is well over the 60 MHz requirement. Also, as shown in FIG. 15, open loop gain of OTA 340 is 63 dB, which surpasses the necessary theoretical gain of 48 dB. Finally, as FIG. 16 shows, at the required unity gain bandwidth, the phase margin of OTA 340 is approximately 10°, which in turn avoids stability problems at the required unity gain bandwidth.

b. One-bit quantizers

Figure 17:
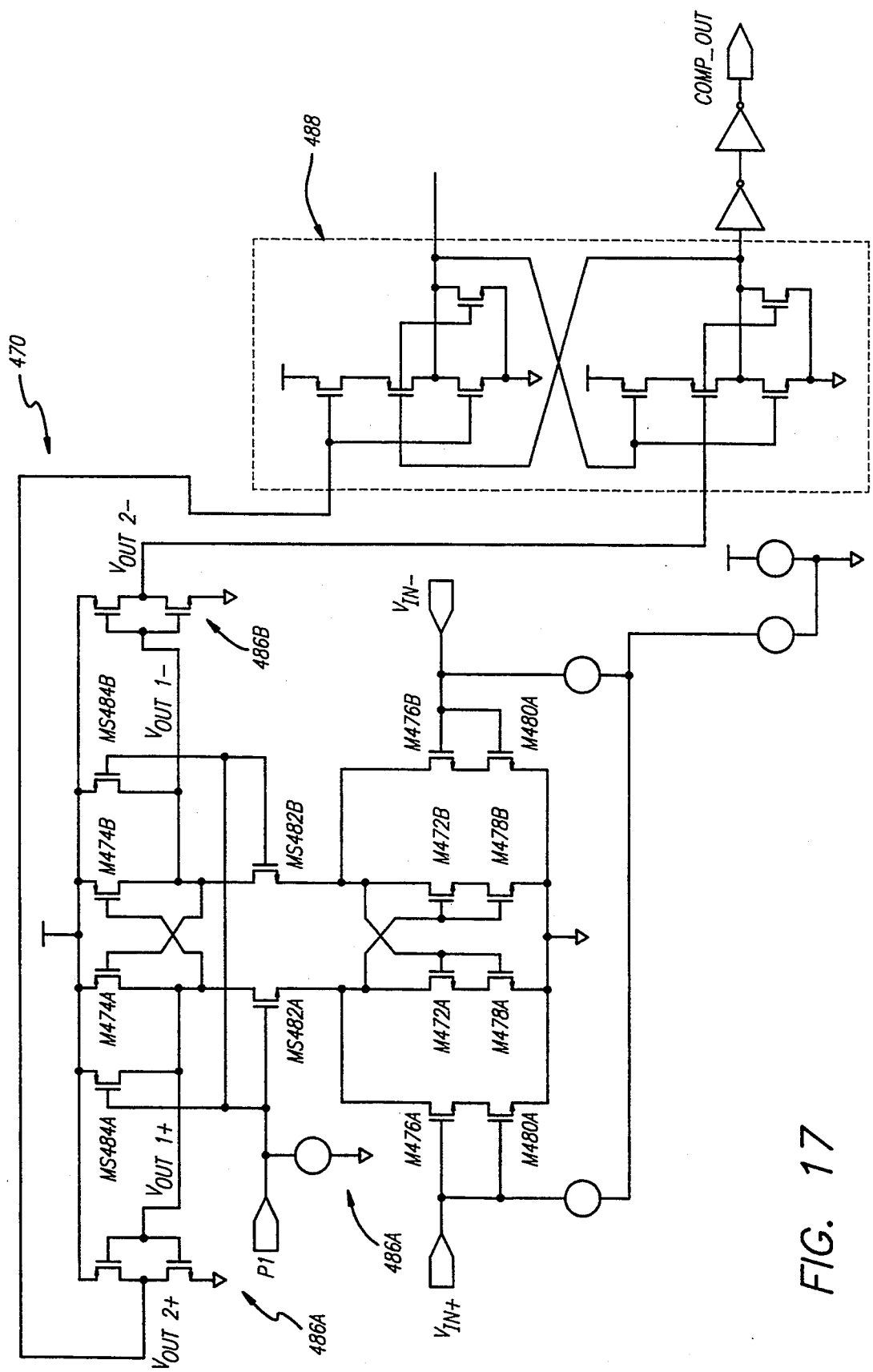
FIG. 17 presents the circuit diagram of one comparator that is used by the second order Sigma-Delta modulator of FIG. 9.

As FIG. 9 shows, both comparator 276 and comparator 278 receive differential outputs of the second OTA 272 and, depending on comparator selector signal 298, one of these comparators produces the quantized output of modulator 270 at node 299. FIG. 17 presents one embodiment of comparator 276. Comparator 470 is a simple regenerative latch that does not have preamplification or offset cancellation. This comparator is fully differential, with inputs $V_{IN+}$ and $V_{IN-}$ and buffered outputs $V_{OUT2+}$ and $V_{OUT2-}$. The core of this comparator is formed by two inverters consisting of transistors M472A, M474A, M472B and M474B which are connected as a latch. During the reset phase of the comparator (i.e. Phase 1 is low), switches MS482A and MS482B are open, thus breaking the positive feedback of the latch. Switches MS484A and MS484B pull up the outputs of the comparator, $V_{OUT1+}$ and $V_{OUT1-}$, to the positive supply rail. The drain of M472A and M472B are discharged through the input transistors M476 and M480.

During the compare phase (i.e. Phase I is high), switches MS482A and MS482B are closed and the positive feedback in the latch is enabled. The voltage difference applied at the inputs $V_{IN+}$ and $V_{IN-}$ causes the difference between output $V_{OUT+}$ and $V_{OUT-}$ to regenerate exponentially towards the supply voltage. The outputs are then interpreted as a logic zero or one representing the result of the comparison. The outputs $V_{OUT2+}$ and $V_{OUT2-}$ of buffer inverters 486A and 486B are fed into set/reset flip flop 488 which holds the result of the comparison for a full clock cycle. In this latch, the cross coupled devices are strobed at their drains, rather than their sources, to eliminate backgating effects and promote faster regeneration.

Comparator 470 is superior to prior art comparator 180 of FIG. 5, since the response of comparator 470 to input signals $V_{IN+}$ and $V_{IN-}$ is faster than the response of comparator 180. Comparator 470 has a faster response because level shifting NMOS transistors M478 and M480 level shift up the input of comparator 470, which in turn decreases the amount of time it takes for the input transistors (i.e. transistors M472 and M476) to reach their trip points. More precisely, since the output of the OTA 340 is centered around 3.2 volts, the input of comparator 470 is level shifted up so as to decrease the amount of time that it takes the input transistors to reach their trip points (i.e. the points were the input transistors begin to conduct). In other words, by inserting level shifting input transistors M478 and M480 into prior art comparator 180 of FIG. 5, the trip points of the input stage transistors are increased from $V_T$(of transistors M476) to $V_T$(of transistors M476)+ $V_{DS}$ (of transistors M480), and thus are more responsive to the output voltage of OTA 340.

Figure 18:
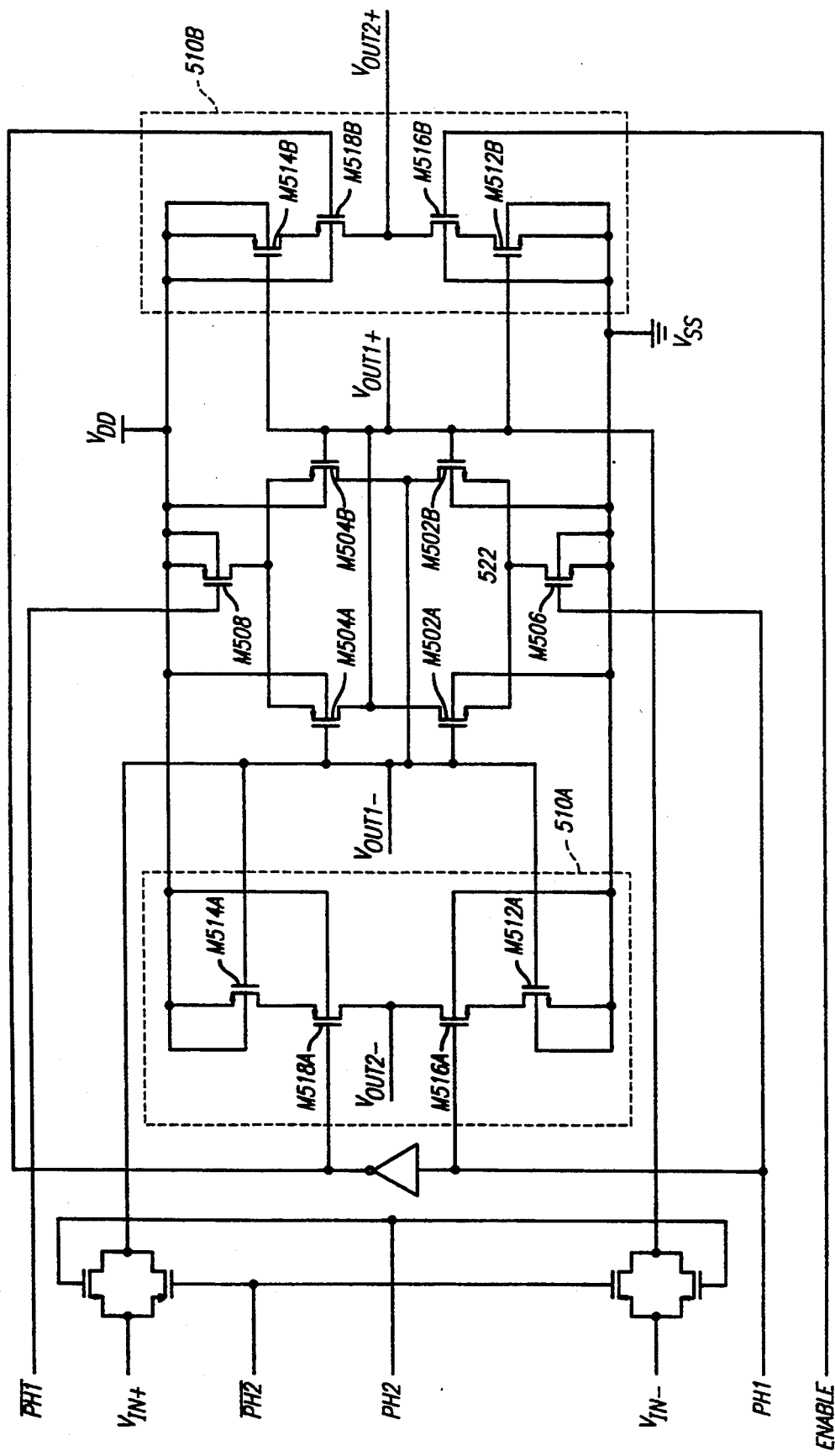
FIG. 18 presents the circuit diagram of a second comparator that is used by the second order Sigma-Delta modulator of FIG. 9.

As mentioned before, comparator 278 of FIG. 9 can also be used to quantize the output of the second integrator. FIG. 18 presents one embodiment of comparator 278. Like comparator 470 of FIG. 17, comparator 500 is a simple latch with fully differential inputs $V_{IN+}$ and $V_{IN-}$, buffered outputs $V_{OUT2+}$ and $V_{OUT2-}$, and a core formed by two inverters (consisting of transistors M502A, M504A, M502B and M504B). However, unlike comparator 470, this comparator does not require its input transistors to be level shifted, since the output voltage of the second integrator optimally drives this comparator.

During the reset phase of comparator 500 (Phase I is high, Phase 2 is low), PMOS transistor M508 charges node 520 to $V_{DD}$, while NMOS transistor M506 charges node 522 to ground. During the comparison phase of the comparator (Phase 1 is low, and Phase 2 is high), the positive differential output of the second amplifier is supplied to the gate of transistors M502A and M504A, while the negative differential output is supplied to the gate of transistors M502B and M504B. The difference between these two input signals in turn causes the difference between output $V_{OUT1+}$ and $V_{OUT1-}$ to regenerate exponentially towards the supply voltage. The outputs are then interpreted as a logic zero or one representing the result of the comparison. The power consumption of the second order Sigma-Delta modulator can be reduced by disabling this comparator. This comparator is disabled when enable signal 513 goes low, which in turn causes transistors M516 and M518 to tristate the output of the comparator.

Figure 19:
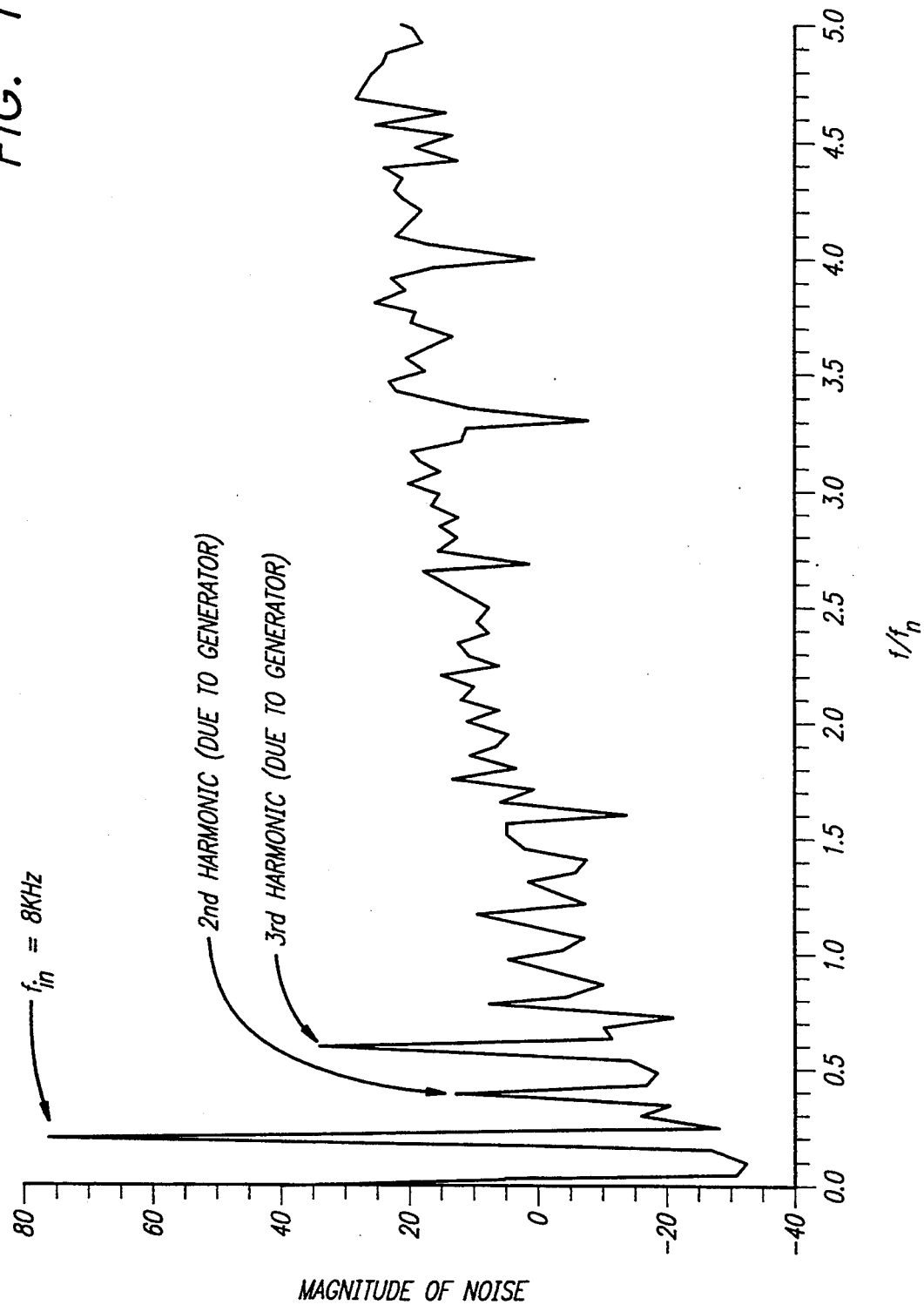
FIG. 19 presents the noise spectral density of the Sigma-Delta modulator of FIG. 9.

These superior amplifiers and comparators allow second order Sigma-Delta modulator 270 of FIG. 9 to provide a true 16-bit resolution. As mentioned before, in order for a Sigma-Delta modulator to provide 16 bits of resolution, it must attenuate the baseband quantization noise by 96 dB. As the noise spectral density of Sigma-Delta modulator 270 in FIG. 19 shows (for an 8 KHz audio signal), the modulator of the present invention attenuates the baseband (i.e. the frequency range from DC to $0.5f_N$) quantization noise energy by more than 96 dB, and thus is a true 16-bit second order Sigma-Delta modulator. It should be noted that tests revealed that the second and the third harmonics that appear in FIG. 19 are due to the signal generator.

2. Decimation: Comb Filter X and FIR Filter in DSP

As shown in FIG. 7, the decimation filter of the present invention (which digitally filters out the quantization noise that second order Sigma-Delta modulator 222 moves out of the baseband) is realized by using at least two FIR filters (i.e. comb filter 224 and FIR filter 228). For several reasons, it is advantageous to perform the averaging function with two or more FIR filters. First, it is advantageous since it increases the ratio of the width of the transition band of the filter to the sampling rate, and thereby decreases the hardware complexity which increases the feasibility for monolithic implementation of the analog and the digital sections on a single die. Second, increasing the number of digital filters increases the amount of quantization noise that can be removed, since often a single filter is not very effective at removing a large amount of out-of-baseband noise. Third, distributed FIR filters are used because the initial FIR filter (i.e the comb filter) causes substantial magnitude drooping at the upper region of the baseband. Fourth, distributed FIR filters reduce the number of delay elements and coefficients that need to be used, and thereby reduce the latency which is critical in some applications. Fifth, with a comb filter, the filter response directly scales with the clock since all the coefficients are one with the exception of the gain coefficient, which is a function of the order of the filter; consequently, unlike FIR filters, a change in the bandwidth does not require a change in the coefficients of the comb filter.

a. Programmable Comb Filter

Figure 20:
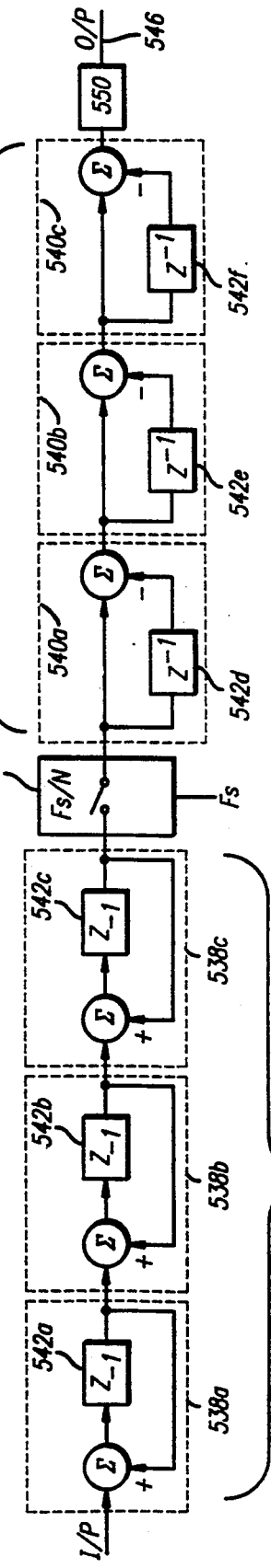
FIG. 20 presents the block diagram of the programmable comb filter of FIG. 7.

FIG. 20 present one embodiment of third order comb filter 224 of FIG. 7. Third order comb filter 530 digitally filters out most of the out-of-baseband quantization noise energy by averaging the output of the modulator over N input sample periods and by performing a sample rate reduction of N:1. Comb filters are special FIR filters which use equal weighting (i.e. the filter coefficients are all equal), 1.5 and thus are very economical since no multipliers and no external registers for storing filter coefficients are required; the only registers that are required are delay elements 542 which are internal registers. In addition, this filter is a third order comb filter, since, in order for a comb filter to sufficiently attenuate out-of-baseband noise energy, the order of the comb filter has to be one larger than the order of the modulator (which is a second order modulator).

Comb filter 530 has a sinc (i.e. (sin x)/x) filter response, and has the following transfer function: $D1(z)=(1/N*((1-z^{-N})/(1-z^{-1})))^3$. Consequently, as FIG. 20 shows, this comb filter has three parts: integration stage 532, resampling stage 534, and differentiation stage 536. The three integrators 538 operate at the original sampling rate, $F_S$, and implement the denominator of $D1(z)$. They are followed by resampling stage 534, which performs the N:I rate reduction function of comb filter 530 by sampling the output of the integration stage at frequency $F_S/N$. The resampled output of the resampling stage is then supplied to the three differentiators 540 (operating at $F_S/N$), which realize the numerator of $D1(z)$. In turn, in order to realize the gain term $(1/N)^3$, the output of the differentiation stage is supplied to shifter 550, which simply changes the bit significance of the output of the differentiation stage. Finally, the 20-bit output (having 12-bits of resolution) of comb filter 530 appears at node 546.

The default sample rate reduction of this comb filter is 64:1. However, since this comb filter is programmable, an operator can adjust the sample rate reduction (i.e. the operator can select the number of sample periods N). Comb filter 530 is also programmable since it receives clock signal $F_S$ of the modulator. This programmability feature of comb filter 530 increases the signal to noise ratio of the converter, since (by receiving the modulator clock signal and adjusting the number of sample periods) the comb filter's sample rate reduction can be optimized for a particular input signal with a specific bandwidth.

Furthermore, comb filter 530 uses a 20-bit data path (having 19 effective data bits and 1 sign data bit), in order to enable the decimator (which is formed by the comb filter and the FIR filter) to provide 16 bits of resolution to the processor. The minimum register and adder wordlengths are 19 bits, which are derived from the following equation: Wordlength=(order of comb filter) * $\log_2$ (sample rate reduction ratio)+(number of input bits). Comb filter 530 uses a 20 bit data path, since it also has one sign bit. In addition, since comb filter 530 uses two's compliment number representation with roll over registers, the fixed 20-bit data path provides an effective dynamic range of 40 bits. More precisely, in order to suppress the effect of register overflow in the integrators when a DC signal is supplied to the filter, comb filter 530 is implemented by using a two's complement number representation that allows wrap-around from the most positive number to the most negative number. Under this condition, register overflows effectively implement a modulo operation on the register inputs. Thus, the modulo arithmetic performed produces the correct filter output since the registers in both sections of the comb filter (i.e. in both the numerator and the denominator sections) are wide enough to hold the largest possible output of the composite filter. Finally, in one embodiment of the present invention, comb filter 530 is realized separately from the Sigma-Delta modulator, by translating the block diagram of comb filter 530 (shown in FIG. 20) into a VHDL description which is implemented with a FPGA.

b. FIR Filter

As FIG. 7 shows, the output of the programmable comb filter is supplied to FIR filter which is realized in the DSP. This filter is used since comb filter 224 is not very effective at removing a large volume of out-of-baseband quantization noise, and since the frequency response of the comb-filter causes some magnitude drooping at the upper region of the baseband. FIR filter 228 digitally filters out the remaining out-of-baseband quantization noise energy by computing a weighted average of a finite number of the comb filter's outputs and by performing a 4:1 rate reduction. More precisely, FIR filter 228 (1) receives from comb filter 224 the 20-bit samples (each having 12-bits of resolution) at a frequency of $F_S/N$, (2) attenuates the out-of-baseband (i.e. frequency range from DC to $f_N/2$) quantization noise energy, and (3) provides processor 230 with a set of 16-bit samples (each having 16-bits of resolution) representing the input signal at the Nyquist sampling rate $f_N$. In addition, FIR filter restores the flat baseband frequency response by counteracting the magnitude drooping at the upper baseband frequencies due to the comb filter.

Figure 21:
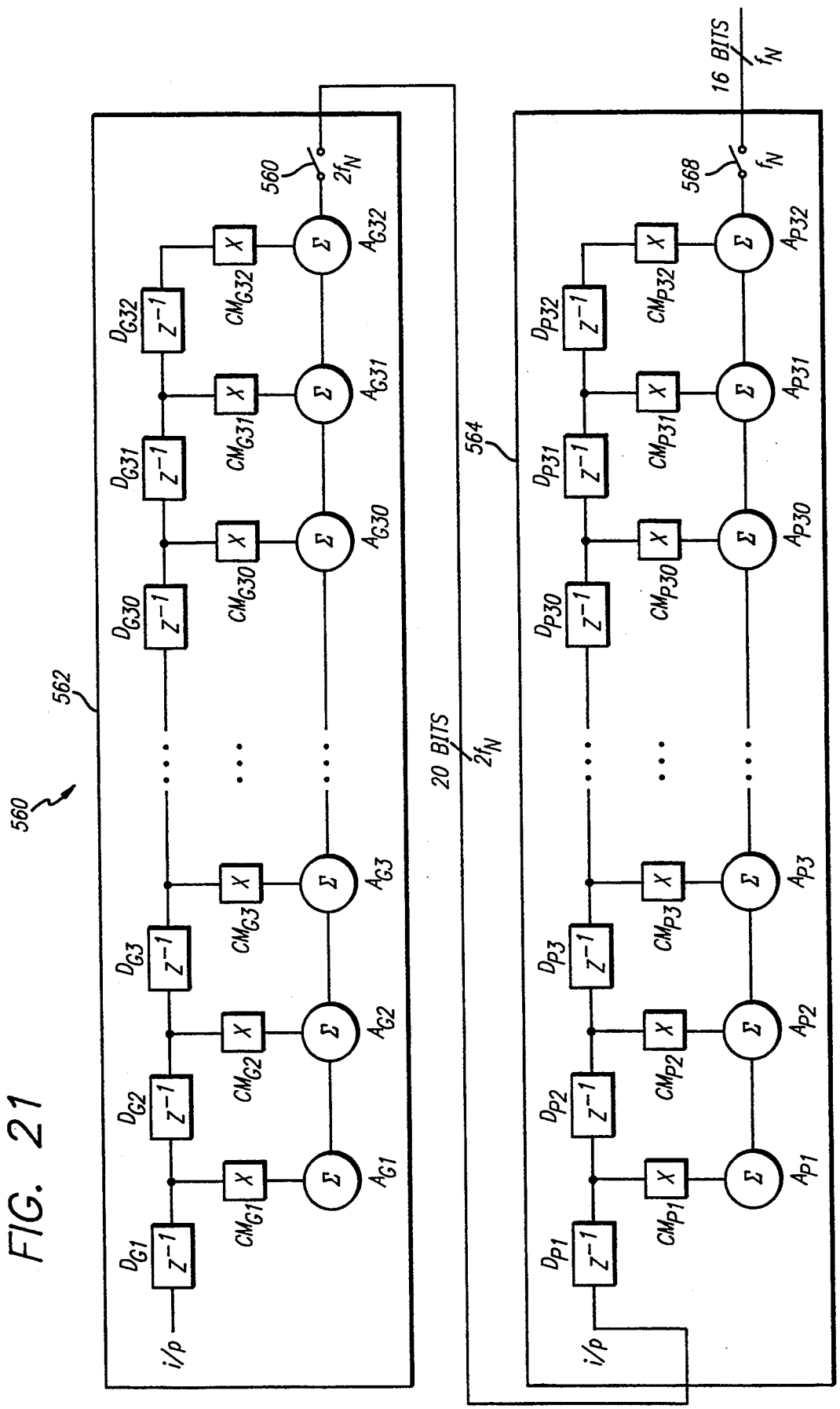
FIG. 21 presents the block diagram of one embodiment of the FIR filter of FIG. 7.

One embodiment of FIR filter 228 of FIG. 7 is shown in FIG. 21. As shown in this figure, FIR filter 560 comprises two cascaded half-band filters 562 and 564. Both of these filters track the bandwidth of the input signal, since they are implemented in software and thus have their clock signals dependent on the supplied modulator clock $F_S$. The first half band filter is Goodman filter 562, which performs a 2:1 rate reduction. Goodman filter 562 (1) has delay elements $D_G$, coefficient multipliers $CM_G$, and adders $A_G$ (all operating at frequency $4f_N$), for computing a weighted average of the output of the comb filter; and (2) has sampler 566 for sampling the computed weighted average at frequency $2f_N$. This filter is used to remove some of the out-of-baseband quantization noise that the comb filter did not remove.

In order to suppress the effect of register overflow, Goodman filter 562 is implemented by using a two's complement number representation that allows wrap-around from the most positive number to the most negative number. Goodman filter 562 also restores the flat baseband frequency response by counteracting the magnitude drooping at the upper baseband frequencies that are caused by the comb filter. More precisely, in order to rectify the magnitude drooping at the upper baseband frequencies, the Park-McClellan recommended 32 coefficients are slightly adjusted in order to cause the frequency response of Goodman filter 562 to have a slight positive slope (i.e. to have a x/(sin x) response) from DC to the 3 dB frequency (which is approximately $0.9f_N$). In addition, the adjusted Park-McClellan coefficient values ($CM_{G1}$–$CM_{G32}$) optimally set the poles and the zeroes in the frequency response of the Goodman filter, which in turn establish the location of the 3 dB and the 96 dB frequencies (which are respectively $0.9f_N$ and $1.1f_N$) and attenuate the out-of-baseband quantization noise. Finally, in another implementation of FIR filter 228 of FIG. 7, an infinite impulse response (i.e. IIR) filter with a high damping coefficient (Q) can be used in place of the Goodman filter; a bilinear transform can be used to insure stability and reduce the number of coefficients to 5 (including gain scaling).

The second half band filter is Post-Processor filter 564, which receives the 20-bit output of Goodman filter 562 and performs a 2:1 rate reduction. Post-Processor filter 564 (1) has delay elements $D_P$, coefficient multipliers $CM_P$, and adders $A_P$ (all operating at frequency $2f_N$), for computing a weighted average of the output of the Goodman filter; and (2) has sampler 568 for sampling the computed weighted average at frequency $f_N$. This filter is used to remove the remaining out-of-baseband quantization noise that the previous filters did not remove. More precisely, the Park-McClellan algorithm is used to derive the 32 coefficient values (CMP1–CMP32) that optimally set the poles and the zeroes in the frequency response of the Post-Processor filter, which in turn establish the location of the 3 dB and the 96 dB frequencies (which are respectively $0.45f_N$ and $0.55f_N$) and attenuate the out-of-baseband quantization noise. For example, if the input signal is an audio signal, the Park-McClellan derived coefficients are selected so that $f_{3dB}$ equals 3.6 KHz and the $f_{96dB}$ equals 4.4 KHz. Furthermore, Post-Processor filter 564 is implemented by using a two's complement number representation that allows wrap-around from the most positive number to the most negative number, so as to suppress the effect of register overflow. Finally, in order to reduce the size of the half band filters (i.e. the Goodman filter and the Post-Processor filter), to reduce latency, and to increase the speed of the filters, the half band filters can be realized with a Cononic Sign Digit (i.e. CSD) implementation; in other words, by restricting the coefficient sets through limiting the number of binary ones in the coefficients, the number of shift add registers is reduced, which in turn increases the speed and decreases the size of the filters.

3. Potential Uses

The second order Sigma-Delta based converter of the present invention provides a true 16-bit design for any application involving frequencies up to 23.4 KHz. This Sigma-Delta based converters can also be used with applications that have a wider bandwidth than 23.4 KHz (such as Group Specialty Mobile-GSM-applications that have a bandwidth of 200 MHz); however, in such instances, going to wider bandwidths effectively reduces the oversampling ratio, which in turn reduces the dynamic range of the converter.

The second order Sigma-Delta modulator of the present invention also can be used as a calibration block for faster converters. Higher speed converters, such as successive approximation and flash type converters, suffer from non linearity and offset errors beyond the 8-bit level on silicon due to mis-match. More precisely, the resolution of high speed converters is determined by the number and spacing of reference levels that are pre-defined in a calibrator. The setting of these reference levels becomes more cumbersome and expensive as the resolution of these high speed converters increases. For example, a 16-bit high speed A/D converter requires 65535 different reference levels, which causes the spacing between the reference levels to equal 30 μV when the input signal is two volts peak-to-peak. Consequently, expensive laser trimming techniques have to be employed in order to create an accurate calibrator.

Figure 22:
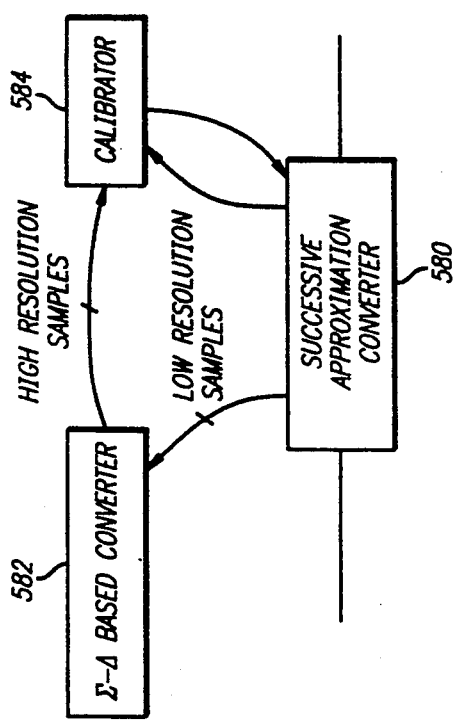
FIG. 22 presents the block diagram of a Sigma-Delta based converter calibrating a calibrator used by a Successive Approximation converter.

However, the inherent linearity afforded by Sigma-Delta technology can be used to great advantage as a calibrator trim mechanism during startup or reset operations, which in turn eliminates the need for costly active trims. In other words, since Sigma-Delta based converters achieve their high resolution by simply taking advantage of the high speeds achieved by VLSI technology and thereby do not require expensive calibrators to achieve their high resolution, Sigma-Delta based converters can be used to calibrate the calibrators of high speed converters. For example, as shown in FIG. 22, Sigma-Delta based converter 582 calibrates calibrator 584 of successive approximation converter 580 at DC (i.e. calibrates calibrator 584 during a short interval after converter 580 is activated), (1) by receiving the high speed converter's low resolution samples of the processor's test signal, (2) by increasing the resolution of these samples, and (3) by supplying the high resolution samples to calibrator 584. Once all the reference levels in calibrator 584 are defined, Sigma-Delta based converter 582 is disabled and high speed converter 580 utilizes calibrator 584 in order to achieve its high converting speeds. Therefore, the use of Sigma-Delta based converter 582 obviates the need for expensive laser trimming of calibrator 584.

We claim:

1. An oversampling analog to digital converter, for converting an input signal having a baseband frequency into an output set of high resolution samples having an output frequency and representing said input signal, comprising:

(a) a Sigma-Delta modulator for (i) receiving, from a clock pulse generator, an oversampling clock signal having an oversampling frequency, (ii) receiving said input signal, and (iii) sampling said input signal at said oversampling frequency and producing a first set of coarsely quantized samples having said oversampling frequency and representing said input signal, wherein said oversampling attenuates quantization noise in the frequency range from DC to said basedband frequency while increasing quantization noise for frequencies greater than said baseband frequency; and (b) a digital filter for (i) receiving said oversampling clock signal, (ii) receiving said first set of samples from said modulator, and (iii) computing a first weighted average of an adjustable number of samples in said first set of samples, and thereby producing a second set of samples representing said input signal and having a second sampling frequency equal to said oversampling frequency divided by said adjustable number of samples used in computing said first weighted average, wherein said weighted averaging attenuates quantization noise for frequencies greater than said baseband frequency.

2. The oversampling analog to digital converter of claim 1, wherein said digital filter is a programmable primary comb filter comprising a predetermined number (K) of cascaded secondary comb filters, wherein said first set of samples arrive at said primary comb filter a predetermined number of bits (Bi) at a time, said adjustable number is at most equal to a predetermined maximum number (M), and said primary comb filter has a minimum number of bit paths (W) equal to $K*\log_2(M)+B_i$.

3. The oversampling analog to digital converter of claim 2 further comprising a second digital filter for (i) receiving said oversampling clock signal, (ii) receiving said second set of samples from said first digital filter, and (iii) computing a second weighted average of a predetermined number of samples in said second set of samples and thereby producing said output set of high resolution samples.

4. The oversampling analog to digital converter of claim 3, wherein said second digital filter is realized in a digital signal processor having at least one processor that receives said output set of high resolution samples from said second digital filter.

5. The oversampling analog to digital converter of claim 4, wherein said second digital filter is a Finite Impulse Response (FIR) filter.

6. The oversampling analog to digital converter of claim 5, wherein said Sigma-Delta modulator is a second order Sigma-Delta modulator, said primary comb filter is a third order comb filter having at least 19 bit paths, and said secondary comb filters are first order comb filters.

7. The oversampling analog to digital converter of claim 5, wherein said FIR filter comprises a first half-band filter and a second half-band filter, wherein said first half-band filter is a Goodman filter.

8. The oversampling analog to digital converter of claim 3, coupled to a high speed analog to digital converter, for calibrating a calibrator of said high speed analog to digital converter.

9. A Sigma-Delta modulator, for oversampling and coarsely quantizing an input signal, comprising:

at least one sampler operating at an oversampling frequency for converting said input signal into a first set of digital signals;

at least one transforming circuit for transforming said first set of digital signals into a second set of digital signals; and at least one integrator receiving said second set of digital signals and having a differential class AB operational transconductance amplifier (OTA) capable of processing digital signals at said oversampling frequency;

wherein said OTA includes a differential cross-coupled input stage, driven by N-channel MOS transistors and having a plurality of input currents, for receiving said second set of digital signals, a first biasing stage having a plurality of biasing currents for establishing and maintaining the optimal biasing points of said OTA, wherein said optimal biasing maximize the linear range of operation of said OTA, a differential output stage driven by said input stage, wherein said input currents are mirrored into said output stage to produce a plurality of output currents, a dynamic biasing stage, coupled to said input and output stages, for dynamically biasing said output stage, a common mode feedback stage, coupled to said differential output stage and using switch capacitor sampling techniques, for establishing and maintaining the optimal biasing points of said OTA, and common mode feedback disabling circuitry for disabling said common mode feedback stage, thereby enabling said OTA to operate continuously.

10. The Sigma-Delta modulator of claim 9, wherein said optimal biasing points are further established and maintained by a current generator establishing the biasing currents in said OTA by producing at least one reference current and mirroring said reference current into said biasing stage, wherein said biasing currents establish and maintain said biasing points to be independent of transistor conductance parameter variations, operating temperature variations, and power supply variations.

11. The Sigma-Delta modulator of claim 10, wherein said reference current and said biasing currents are independent of process and power supply variations, while being slightly dependent on variations in operating temperature so as to offset the effects due to operating temperature variations on the optimal biasing points of said OTA.

12. The Sigma-Delta modulator of claim 11, wherein said current generator uses a Bandgap Reference technique to establish a voltage across a resistor, wherein said voltage is independent of power supply variations and transistor conductance parameter variations.

13. The Sigma-Delta modulator of claim 12, wherein said current generator uses a Proportional To Absolute Temperature (PTAT) technique to establish the desired temperature dependence of said reference current and said biasing currents.

14. The Sigma-Delta modulator of claim 13, wherein said current generator comprises a generating stage and an output stage, wherein said generating stage includes:

an operational amplifier having a negative input terminal, a positive input terminal, and an output terminal, wherein a first biasing voltage appears at the output terminal of said operational amplifier, said resistor having a first terminal coupled to said positive input terminal of said operational amplifier and a second terminal, at least a first MOS transistor and a second MOS transistor, each MOS transistor having a first terminal, a second terminal, and a third terminal, wherein said first terminals of said MOS transistors are coupled to a first supply voltage, said second terminals of said MOS transistors are coupled to said output terminal of said amplifier, and said third terminal of said first MOS transistor is coupled to said first terminal of said resistor, at least a first and a second parasitic bipolar junction transistors, each having a collector, a base, and an emitter, wherein said emitter of said second bipolar junction transistor has a larger area than the emitter of said first bipolar junction transistor, wherein said bases and said emitters of said bipolar junction transistor are coupled to a second supply voltage, said collector of said first bipolar junction transistor is coupled to said second terminal of said resistor, and said collector of said second bipolar transistor is coupled to the third terminal of said second MOS transistor and to said negative input terminal of said operational amplifier, wherein said output stage includes a third MOS transistor and a fourth MOS transistor each having a first terminal, a second terminal, and a third terminal, wherein said reference current flows through said output stage and is generated by coupling the second terminal of said third MOS transistor with said output terminal of said operational amplifier, wherein said third terminal of said third MOS transistor is coupled to said first supply voltage, said first terminal of said third MOS transistor is coupled to said first and second terminal of said fourth MOS, and said third terminal of said fourth MOS is coupled to said second supply voltage.

15. The Sigma-Delta modulator of claim 9, wherein said OTA further comprises a plurality of P-channel MOS transistors each having a source and a body, wherein each of said P-channel MOS transistors has its body coupled to its source.

16. The Sigma-Delta modulator of claim 9 further comprising a level shifted comparator coupled to said integrator and having an input stage and an output stage, wherein said input stage of said comparator is level shifted so that the trip points of said comparator are close to the biasing points of said OTA.

* * * * *

UNITED STATES PATENT AND TRADEMARK OFFICE
CERTIFICATE OF CORRECTION

PATENT NO. : 5,408,235
DATED : April 18, 1995
INVENTOR(S) : Doyle et al.

It is certified that error appears in the above-identified patent and that said Letters Patent is hereby corrected as shown below:

In column 2, at line 22, delete "A" and substitute --$\Delta$--

In column 2, at line 22, delete ">0;" and substitute --$\geq 0$;--

In column 2, at line 52, delete "$S_B$~" and substitute --$S_B \approx$--

In column 3, at line 27, delete "gain~6" and substitute --gain$\approx$6--

In column 3, at line 52, delete "A" and substitue --$\Delta$--

In column 4, at line 67, delete "(VIN+ and VIN-)" and substitute --($V_{IN+}$ and $V_{IN-}$)--

In column 5, at line 29, delete "VOUT+ and VOUT-" and substitute -- $V_{OUT+}$ and $V_{OUT-}$ --

In column 10, at line 17, delete " CPMOS") " and substitute --("PMOS")--

In column 11, at line 68, delete "A" and substitute --$\Delta$--

In column 12, at line 58, delete "Phase I" and substitute --Phase 1--

In column 17, at line 11, delete "*In X" and substitute --*ln X--

In column 17, at line 12, delete "1n X" and substitute --ln X--

In column 19, at line 63, delete "Phase I" and substitute --Phase 1--

UNITED STATES PATENT AND TRADEMARK OFFICE
CERTIFICATE OF CORRECTION

PATENT NO.  :  5,408,235
DATED       :  April 18, 1995
INVENTOR(S) :  Doyle et al.

It is certified that error appears in the above-identified patent and that said Letters Patent is hereby corrected as shown below:

In column 20, at line 41, delete "Phase I" and substitute
   --Phase 1--
In column 21, at line 44, delete "N:I" and substitute --N:1--
In column 21, at line 46, delete "1.5"
In column 21, at line 63, delete "N:I" and substitute --N:1--
In column 23, at line 48, delete "Dp" and substitute --Dp--

Signed and Sealed this

First Day of October, 1996

BRUCE LEHMAN

Attest:

*Attesting Officer*          *Commissioner of Patents and Trademarks*